(12) United States Patent
Hsueh et al.

(10) Patent No.: US 11,742,291 B2
(45) Date of Patent: Aug. 29, 2023

(54) DIFFUSION BARRIER LAYER FOR CONDUCTIVE VIA TO DECREASE CONTACT RESISTANCE

(71) Applicant: Taiwan Semiconductor Manufacturing Company, Ltd., Hsin-Chu (TW)

(72) Inventors: Hsiu-Wen Hsueh, Taichung (TW); Chii-Ping Chen, Hsinchu (TW); Neng-Jye Yang, Hsinchu (TW); Ya-Lien Lee, Baoshan Township (TW); An-Jiao Fu, Taipei (TW); Ya-Ching Tseng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/834,148

(22) Filed: Jun. 7, 2022

(65) Prior Publication Data
US 2022/0310526 A1    Sep. 29, 2022

Related U.S. Application Data

(62) Division of application No. 16/814,116, filed on Mar. 10, 2020, now Pat. No. 11,362,035.

(51) Int. Cl.
*H01L 23/532* (2006.01)
*H01L 23/528* (2006.01)

(52) U.S. Cl.
CPC ...... *H01L 23/53295* (2013.01); *H01L 23/528* (2013.01); *H01L 23/53228* (2013.01)

(58) Field of Classification Search
CPC .................................................. H01L 23/53295
(Continued)

(56) References Cited

U.S. PATENT DOCUMENTS

| 2004/0130030 A1* | 7/2004 | Kunimune ........ H01L 21/76849 438/118 |
| 2014/0035143 A1* | 2/2014 | Lee .......................... H01L 23/50 438/653 |
| 2020/0098619 A1* | 3/2020 | Marieb ............. H01L 21/76852 |

FOREIGN PATENT DOCUMENTS

| CN | 107068855 A | * 8/2017 | ........... H01L 27/228 |
| CN | 107564970 U | 11/2019 | |

OTHER PUBLICATIONS

Non-Final Office Action dated Jun. 10, 2021 for U.S. Appl. No. 16/814,116.
(Continued)

*Primary Examiner* — Ajay Arora
(74) *Attorney, Agent, or Firm* — Eschweiler & Potashnik, LLC

(57) ABSTRACT

Some embodiments relate to a semiconductor structure including a method for forming a semiconductor structure. The method includes forming a lower conductive structure within a first dielectric layer over a substrate. An upper dielectric structure is formed over the lower conductive structure. The upper dielectric structure comprises sidewalls defining an opening over the lower conductive structure. A first liner layer is selectively deposited along the sidewalls of the upper dielectric structure. A conductive body is formed within the opening and over the lower conductive structure. The conductive body has a bottom surface directly overlying a middle region of the lower conductive structure. The first layer is laterally offset from the middle region of the lower conductive structure by a non-zero distance.

20 Claims, 18 Drawing Sheets

(58) Field of Classification Search
USPC .......................................................... 257/774
See application file for complete search history.

(56) References Cited

OTHER PUBLICATIONS

Non-Final Office Action dated Sep. 30, 2021 for U.S. Appl. No. 16/814,116.
Notice of Allowance dated Feb. 16, 2022 for U.S. Appl. No. 16/814,116.

* cited by examiner

DIFFUSION BARRIER LAYER FOR CONDUCTIVE VIA TO DECREASE CONTACT RESISTANCE

REFERENCE TO RELATED APPLICATION

This application is a Divisional of U.S. application Ser. No. 16/814,116, filed on Mar. 10, 2020, the contents of which are hereby incorporated by reference in their entirety.

BACKGROUND

Modern day integrated chips contain millions of semiconductor devices. The semiconductor devices are electrically interconnected by way of back-end-of-the-line metal interconnect layers that are formed above the devices on an integrated chip. A typical integrated chip comprises a plurality of back-end-of-the-line metal interconnect layers including different sized metal wires vertically coupled together with metal contacts (i.e., vias).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
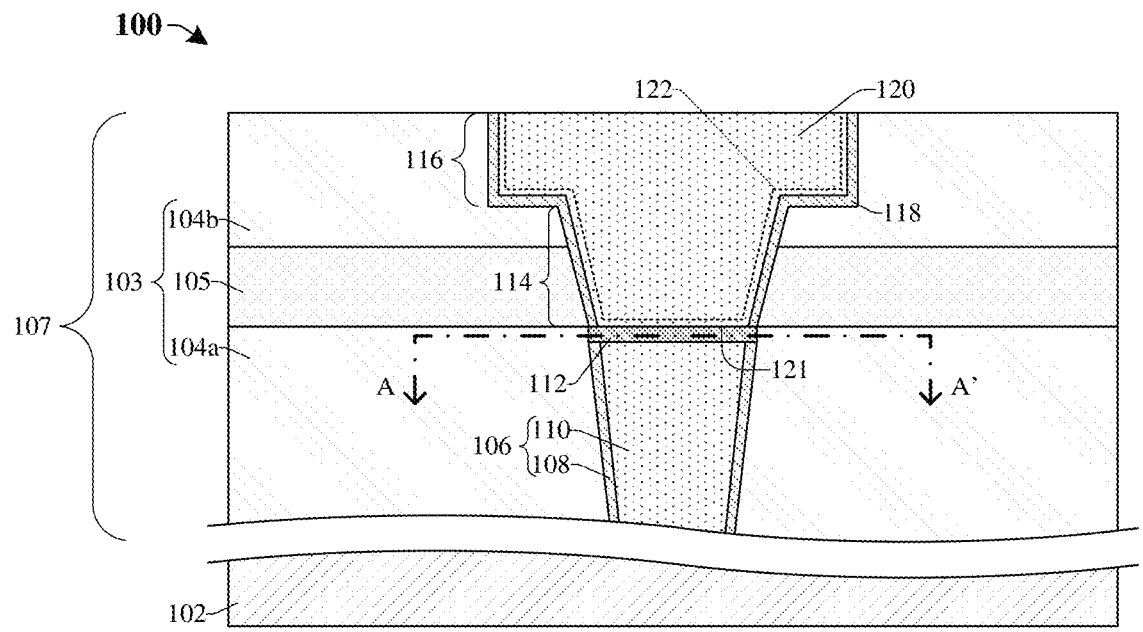
FIG. 1 illustrates a cross-sectional view of some embodiments of an integrated chip having a conductive via and conductive wire with a diffusion barrier layer configured to decrease contact resistance.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips may include a number of semiconductor devices (e.g., transistors, memory devices, etc.) disposed over and/or within a semiconductor substrate. An interconnect structure may be disposed over the semiconductor substrate. The interconnect structure may include conductive interconnect layers having conductive wires and conductive vias disposed within an interconnect dielectric structure. The conductive wires and conductive vias are configured to provide electrical pathways between different semiconductor devices disposed within and/or over the semiconductor substrate.

The conductive interconnect layers of the interconnect structure are often formed using a dual damascene process. For example, a first conductive layer, such as a bottom conductive wire layer, may be formed within a lower inter-level dielectric (ILD) structure over the semiconductor substrate. Subsequently, a dual damascene process may be performed to form a conductive interconnect layer over the first conductive layer. The dual damascene process may include forming a dielectric material over the lower ILD structure. The dielectric material is then selectively etched to form openings in the dielectric material for a via layer and for an adjoining wire layer. After the openings are formed, a diffusion barrier layer is formed over the first conductive layer, such that the diffusion barrier layer lines the openings and contacts the first conductive layer. Subsequently, a conductive body structure is formed within the openings, thereby contacting the diffusion barrier layer and filling the openings. The diffusion barrier layer continuously extends along a bottom surface of the conductive body. Finally, a planarization process is performed on the conductive body structure to remove any excess material, thereby defining the conductive via and the conductive wire of the conductive interconnect layer.

However, the size of conductive features disposed within the integrated chip are decreased to increase a number of devices disposed over the semiconductor substrate, and as the size of the conductive vias decrease a resistance capacitance (RC) delay within the integrated chip increases. This, in part, is because the diffusion barrier layer has a higher resistivity than the conductive body structure. Further, as the dimensions shrink, there is a smaller contact area between the conductive via and an underlying conductive feature (e.g., the first conductive layer), further increasing the resistivity between the diffusion barrier layer and the underlying conductive feature. This may further increase an RC delay and/or resistivity between conductive features disposed within the interconnect structure, thereby decreasing a performance of the integrated chip.

Accordingly, some embodiments of the present disclosure are related to an interconnect structure comprising a conductive via contacting an underlying conductive structure at a barrier free contact interface. Further, a method for forming the interconnect structure according to the present disclosure includes forming a lower conductive structure over a semiconductor substrate. A capping layer is formed along an upper surface of the lower conductive structure. Subsequently, a dual damascene process is performed to define a conductive via and a conductive wire over the lower conductive structure. The dual damascene process includes forming a dielectric structure over the capping layer. The dielectric structure is selectively etched to form an opening and expose an upper surface of the capping layer. Subsequently, a self-assembled monolayer (SAM) is selectively deposited over the capping layer. A diffusion barrier layer is selectively deposited (e.g., by atomic layer deposition (ALD)) within the opening, such that the diffusion barrier layer lines sidewalls of the dielectric structure defining the metallization opening. The SAM is configured to prevent deposition of the diffusion barrier layer on the capping layer, such that the diffusion barrier layer does not extend along the upper surface of the capping layer. A removal process is performed to remove the SAM. Finally, a conductive body is formed in the metallization opening, thereby defining a conductive via and a conductive wire over the lower conductive structure. A barrier free contact region is defined between the bottom surface of the conductive body and the upper surface of the lower conductive structure, where the diffusion barrier layer is laterally offset from the barrier free contact region by a non-zero distance. Thus, the conductive via may be formed such that the diffusion barrier layer is not disposed between the conductive via and the lower conductive structure. This facilitates a diffusion barrier free contact interface between the conductive via and the lower conductive structure, thereby decreasing a RC delay in the interconnect structure and increasing a performance of the integrated circuit.

In addition, some alternative embodiments of the present disclosure are related to an interconnect structure comprising a conductive via contacting an underlying conductive structure with reduced contact resistance. For example, a relatively thin (e.g., a thickness of 10 Angstroms or less) diffusion barrier layer may be disposed between the conductive body of the conductive via and the underlying conductive structure. The relatively thin diffusion barrier layer may continuously laterally extend along a bottom surface of the conductive body, such that the relatively thin diffusion barrier layer is spaced between the conductive body and the underlying conductive structure. Further, the relatively thin diffusion barrier layer is configured to further decrease diffusion of a material (e.g., copper) from the conductive body, thereby increasing a reliability of the interconnect structure. Because the relatively thin diffusion barrier layer has a thickness, for example, of 10 Angstroms or less, an RC delay of the interconnect structure may be reduced while further decreasing diffusion of the material from the conductive body.

FIG. 1 illustrates a cross-sectional view of some embodiments of an integrated chip 100 having an interconnect structure 107 overlying a semiconductor substrate 102.

The interconnect structure 107 includes a lower conductive structure 106, an interconnect dielectric structure 103, a conductive via 114, and a conductive wire 116. In some embodiments, the interconnect dielectric structure 103 includes a first inter-level dielectric (ILD) layer 104a, an etch stop structure 105, and a second ILD layer 104b. The lower conductive structure 106 includes a lower conductive body 110 and a lower conductive liner 108 that laterally encloses the lower conductive body 110. In some embodiments, the lower conductive structure 106 includes a capping layer 112 that continuously extends along an upper surface of the lower conductive body 110. In some embodiments, the lower conductive structure 106 may be configured as a conductive contact, a conductive via, a conductive wire, a top electrode, a top electrode via, or another suitable conductive structure. The lower conductive structure 106 may be disposed within a metallization layer of the interconnect structure 107 that connects overlying conductive layers (e.g., the conductive via 114 and/or the conductive wire 116) to a plurality of semiconductor devices (e.g., transistors, varactors, etc.) disposed over and/or within the semiconductor substrate 102.

The etch stop structure 105 overlies the lower conductive structure 106 and the second ILD layer 104b overlies the etch stop structure 105. The conductive via 114 and the conductive wire 116 are disposed within the etch stop structure 105 and the second ILD layer 104b and directly overlie the lower conductive structure 106. The conductive wire 116 directly overlies the conductive via 114. Further, the conductive wire 116 and the conductive via 114 include a first diffusion barrier layer 118, an adhesive liner 122, and a conductive body 120. In some embodiments, the adhesive liner 122 is disposed between the conductive body 120 and the first diffusion barrier layer 118. In some embodiments, the adhesive liner 122 may, for example, be or comprise cobalt and is configured to increase adhesion between the conductive body 120 and the first diffusion barrier layer 118. In some embodiments, the conductive body 120 is a single conductive structure that continuously extends from the upper surface of the second ILD layer 104b to the capping layer 112. The first diffusion barrier layer 118 laterally surrounds sidewalls of the conductive body 120 and is configured to prevent the diffusion of a material (e.g., copper) from the conductive body 120 to adjacent structures and/or prevent the diffusion of another material into the conductive body 120. In some embodiments, the conductive body 120 and/or the lower conductive body 110 may, for example, respectively be or comprise copper, aluminum, copper manganese, ruthenium, another suitable conductive material, or any combination of the foregoing. In further embodiments, the first diffusion barrier layer 118 may, for example, be or comprise tantalum nitride, titanium nitride, any combination of the foregoing, or the like. Thus, the first diffusion barrier layer 118 may have a higher resistivity than the conductive body 120, the lower conductive body 110, and/or the adhesive liner 122.

In some embodiments, during fabrication of the interconnect structure 107, a self-assemble monolayer (SAM) (not shown) is formed over the capping layer 112 before forming the conductive via 114 over the lower conductive structure 106. The SAM is configured to prevent deposition of at least a portion of the first diffusion barrier layer 118 over the capping layer 112 during a deposition process (e.g., an atomic layer deposition (ALD) process) utilized to form the first diffusion barrier layer 118. Subsequently, a removal process is performed to remove the SAM and the conductive body 120 is formed over the capping layer 112, such that the conductive via 114 contacts the capping layer 112 at a barrier free interface 121. The barrier free interface 121 may be disposed between inner sidewalls of the first diffusion barrier layer 118. In further embodiments, the adhesive liner 122 is omitted (not shown) such that the conductive body 120 directly contacts the capping layer 112 along the barrier free interface 121. By virtue of the conductive via 114 directly contacting the capping layer 112 along the barrier free interface 121, a contact resistance between the conductive via 114 and the lower conductive structure 106 may be reduced, thereby decreasing an RC delay in the integrated chip 100. This is because the conductive body 120 and/or the adhesive liner 122 each have a lower resistivity than the first diffusion barrier layer 118 and the first diffusion barrier layer 118 is laterally offset from the barrier free interface 121. Thus, diffusion to and/or from the conductive body 120 may be mitigated by the first diffusion barrier layer 118 while decreasing a contact resistance between the conductive via 114 and the lower conductive structure 106.

Figure 2:
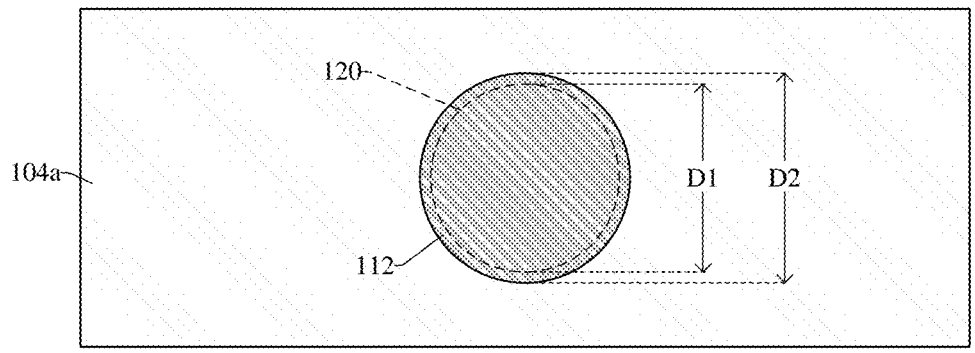
FIG. 2 illustrates a top view of some alternative embodiments of the integrated chip of FIG. 1 taken along the line A-A'.

FIG. 2 illustrates a top view 200 of some alternative embodiments of the integrated chip 100 of FIG. 1 taken along the line A-A'.

In some embodiments, as illustrated by the top view 200, the capping layer 112 and the conductive body 120 of the conductive via (114 of FIG. 1) may each, for example, have a circular shape, an elliptical shape, or another suitable shape when viewed from above. Further, a first diameter D1 of the conductive body 120 is less than a second diameter D2 of the capping layer 112. In some embodiments, the first diameter D1 of the conductive body 120 may correspond to the diameter of a bottom surface of the conductive body 120. As the first diameter D1 is shrunk, a contact resistivity between the conductive via (114 of FIG. 1) and the capping layer 112 may increase. However, because the conductive via (114 of FIG. 1) contacts the capping layer 112 along the barrier free interface (121 of FIG. 1), the increase of the contact resistance may be mitigated, thereby decreasing an RC delay in the integrated chip 100. It will be appreciated that the conductive body 120 is disposed above the line A-A' in FIG. 1, thus the conductive body 120 is illustrated by a dashed circle in the top view 200 of FIG. 2 to show the position and size of the conductive body 120 in relation to the capping layer 112.

Figure 3A:
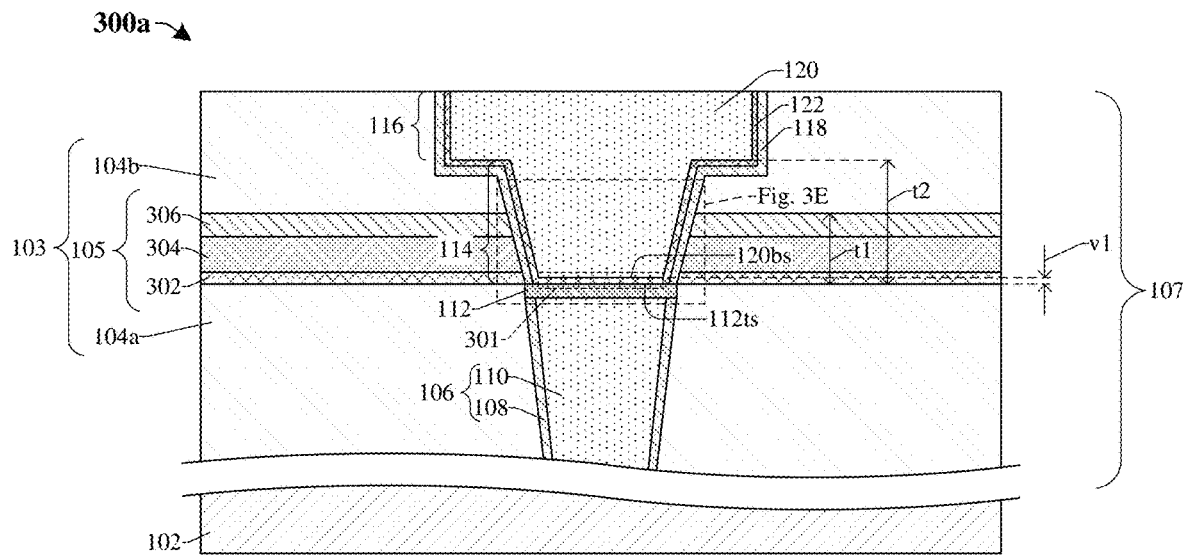
FIGS. 3A-3E, 4A-4D, and 5A-5B illustrate cross-sectional views of some alternative embodiments of an interconnect structure having a conductive via and conductive wire with a diffusion barrier layer overlying a lower conductive structure.

FIG. 3A illustrates a cross-sectional view of some embodiments of an integrated chip 300a having an interconnect structure 107 over a semiconductor substrate 102.

The interconnect structure 107 includes metallization layers (e.g., the lower conductive structure 106, the conductive via 114, the conductive wire 116, etc.) disposed within an interconnect dielectric structure 103. The metallization layers are configured to electrically couple semiconductor devices (not shown) disposed within and/or on the semiconductor substrate 102 together. In some embodiments, the semiconductor substrate 102 may, for example, be or comprise a bulk semiconductor substrate (e.g., bulk silicon), a silicon-on-insulator (SOI) substrate, or another suitable substrate material. The interconnect dielectric structure 103 includes a first inter-level dielectric (ILD) layer 104a, an etch stop structure 105, and a second ILD layer 104b. In further embodiments, the first and second ILD layers 104a, 104b may, for example, respectively be or comprise silicon dioxide, a low-k dielectric material, an extreme low-k dielectric material, any combination of the foregoing, or another suitable dielectric material. The etch stop structure 105 includes a lower etch stop layer 302, a middle dielectric layer 304, and an upper etch stop layer 306. In some embodiments, the lower etch stop layer 302 and the upper etch stop layer 306 may, for example, respectively be or comprise silicon carbide, silicon nitride, silicon oxynitride, or the like. In further embodiments, the middle dielectric layer 304 may, for example, be or comprise silicon dioxide, silicon nitride, silicon carbide, or the like.

The metallization layers disposed within the interconnect structure 107 includes a lower conductive structure 106 disposed within the first ILD layer 104a. The lower conductive structure 106 includes a lower conductive body 110 and a lower conductive liner 108. In further embodiments, the lower conductive body 110 may, for example, be or comprise aluminum, copper, any combination of the foregoing, or the like. The lower conductive liner 108 may, for example, be or comprise titanium nitride, tantalum nitride, or the like. The etch stop structure 105 overlies the first ILD layer 104a and may act as an etch stop layer during a fabrication process utilized to form the interconnect structure 107. A capping layer 112 overlies the lower conductive structure 106. In some embodiments, the capping layer 112 comprises, for example, cobalt, ruthenium, tungsten, a metal comprising one or more dopants, or another suitable conductive material. In some embodiments, the capping layer 112 is configured to reduce and/or prevent diffusion of a material (e.g., copper and/or aluminum) from the lower conductive body 110 to surrounding structures, such as the interconnect dielectric structure 103. For example, during operation and/or fabrication of the integrated chip 300a, a heat within the interconnect structure 107 may increase, thereby promoting or facilitating diffusion of the material (e.g., copper and/or aluminum) from the lower conductive body 110 to the interconnect dielectric structure 103 and/or another adjacent structure. Thus, by virtue of the capping layer 112 extending across an upper surface of the lower conductive structure 106, diffusion of the material from the lower conductive body 110 may be mitigated. This, in part, increases a reliability of the of the integrated chip 300a.

The conductive via 114 and the conductive wire 116 overlie the lower conductive structure 106. The conductive wire 116 is disposed within the second ILD layer 104b and the conductive via 114 is disposed within the second ILD layer 104b and the etch stop structure 105. In some embodiments, the conductive via and wire 114, 116 comprise the conductive body 120, the first diffusion barrier layer 118, and the adhesive liner 122. The conductive body 120 directly overlies the lower conductive structure 106. In some embodiments, a bottom surface 120bs of the conductive body 120 is substantially parallel to a top surface 112ts of the capping layer 112. The adhesive liner 122 continuously warps around the conductive body 120 and continuously laterally extends along the bottom surface 120bs of the conductive body 120. The adhesive liner 122 is configured to facilitate adhesion between the conductive body 120 and the first diffusion barrier layer 118, such that delamination between the conductive body 120 and the first diffusion barrier layer 118 may be mitigated. This in turn increases a reliability of the integrated chip 300a.

In some embodiments, the conductive body 120 and the lower conductive body 110 may, for example, respectively comprise a first conductive material, such as copper, aluminum, copper manganese, ruthenium, another suitable conductive material, or any combination of the foregoing. In further embodiments, the capping layer 112 and the adhesive liner 122 may, for example, respectively comprise a second conductive material, such as cobalt, ruthenium, tungsten, a metal comprising one or more dopants, or the like. In yet further embodiments, the first diffusion barrier layer 118 and the conductive liner 108 may, for example, respectively comprises a third conductive material, such as titanium nitride, tantalum nitride, or the like. In some embodiments, the third conductive material has a higher resistivity than the first conductive material and the second conductive material.

The bottom surface 120bs of the conductive body 120 is separated from the capping layer 112 by a contact interface region 301. In some embodiments, the adhesive liner 122 is disposed within the contact interface region 301, such that the bottom surface 120bs of the conductive body 120 is vertically separated from the top surface of the top surface 112ts by a vertical distance v1. In further embodiments, the vertical distance v1 corresponds to a thickness of the adhesive liner 122 disposed within the contact interface region 301.

In some embodiments, during fabrication of the integrated chip 300a, a self-assembled monolayer (SAM) (not shown) is utilized to selectively deposit the first diffusion barrier layer 118. This ensures that the first diffusion barrier layer 118 is laterally offset from the contact interface region 301 by a non-zero distance in directions away from the bottom surface 120bs of the conductive body 120. This, in part, decreases a contact resistance between the conductive via 114 and the capping layer 112 and/or the lower conductive structure 106. In further embodiments, by virtue of the first diffusion barrier layer 118 being laterally offset from the contact interface region 301, a resistance capacitance (RC) delay time of the integrated chip 300a is reduced. This is because the conductive body 120, the adhesive liner 122, and/or the capping layer 112 each have a lower resistivity than the first diffusion barrier layer 118. In yet further embodiments, the conductive body 120 and/or the lower conductive body 110 are each a single continuous material, such as copper, an alloy of copper manganese, or the like, thereby further reducing the RC delay present in the integrated chip 300a.

In some embodiments, the lower etch stop layer 302 may have a thickness that, for example, is within a range of about 10 to 20 Angstroms, within a range of about 10 to 15 Angstroms, within a range of about 15 to 20 Angstroms, or another suitable thickness value. In further embodiments, the middle dielectric layer 304 may have a thickness that, for example, is within a range of about 30 to 70 Angstroms, within a range of about 30 to 50 Angstroms, within a range of about 50 to 70 Angstroms, or another suitable thickness value. In yet further embodiments, the upper etch stop layer 306 may have a thickness that, for example, is within a range of about 20 to 40 Angstroms, within a range of about 20 to 30 Angstroms, within a range of about 30 to 40 Angstroms, or another suitable thickness value. Further, the etch stop structure 105 has a first thickness t1 that is defined from a bottom surface of the lower etch stop layer 302 and a top surface of the upper etch stop layer 306. In some embodiments, the first thickness t1 is within a range of about 60 to 130 Angstroms, within a range of about 60 to 95 Angstroms, within a range of about 95 to 130 Angstroms, or another suitable thickness value. Furthermore, the conductive via 114 has a thickness t2 that, for example, is within a range of about 200 to 400 Angstroms, within a range of about 200 to 300 Angstroms, within a range of about 300 to 400 Angstroms, or another suitable thickness value.

In addition, a ratio between the second thickness t2 and the first thickness t1 (e.g., t2:t1) is, for example, about 3:1, within a range of about 2.5:1 to 3.5:1, or another suitable value. In some embodiments, if, for example, the ratio between the second thickness t2 and the first thickness t1 is relatively low (e.g., less than about 2.5:1), then dielectric material from the etch stop structure 105 may not be completely removed from an upper surface of the capping layer 112 during fabrication. This may result an increase in contact resistance between the conductive via 114 and the lower conductive structure 106. In further embodiments, if, for example, the ratio between the second thickness t2 and the first thickness t1 is relatively high (e.g., greater than about 3.5:1), then layers underlying the etch stop structure 105 may be damaged during fabrication of the conductive via 114, thereby degrading performance of the integrated chip 300a.

Figure 3B:
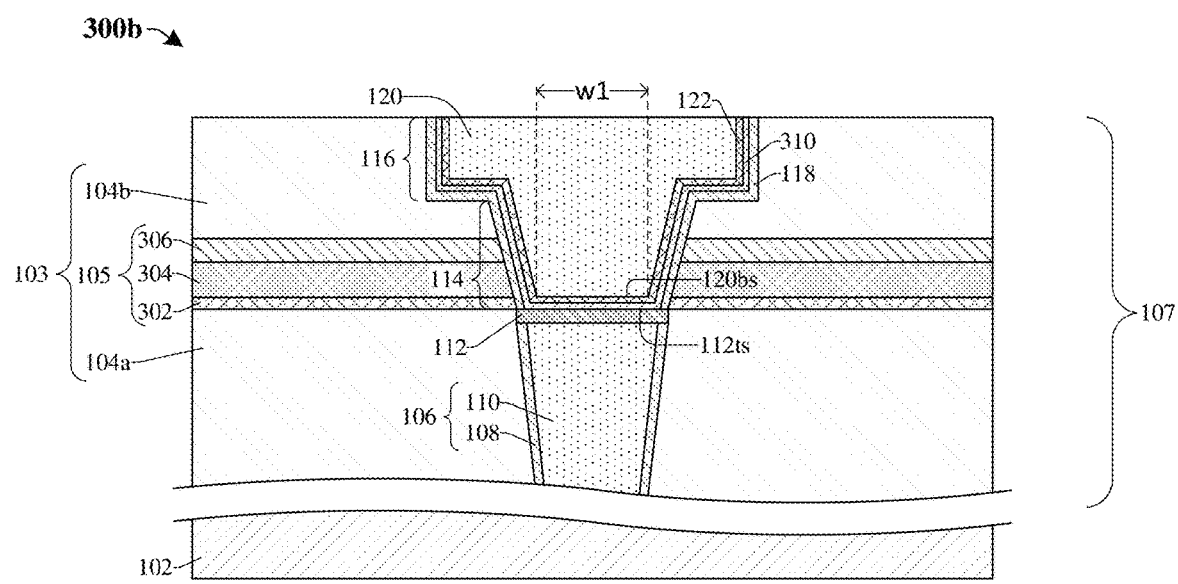

FIG. 3B illustrates a cross-sectional view of some embodiments of an integrated chip 300b comprising a conductive via 114 with a first diffusion barrier layer 118 and a second diffusion barrier layer 310.

In some embodiments, the second diffusion barrier layer 310 is disposed between the first diffusion barrier layer 118 and the adhesive liner 122. The second diffusion barrier layer 310 is configured to further prevent diffusion of a material (e.g., copper) from the conductive body 120, thereby further increasing a reliability of the integrated chip 300b. In some embodiments, the second diffusion barrier layer 310 comprises a same material (e.g., titanium nitride, tantalum nitride, etc.) as the first diffusion barrier layer 118. The second diffusion barrier layer 310 may continuously laterally extend along the top surface 112ts of the capping layer 112.

In some embodiments, a thickness of the first diffusion barrier layer 118 is, for example, about 18 Angstroms, within a range of about 10 to 20 Angstroms, or another suitable thickness value. In further embodiments, a thickness of the second diffusion barrier layer 310 is, for example, about 10 Angstroms, within a range of about 0 to 10 Angstroms, less than or equal to 10 Angstroms, within a range of about 15 to 30 Angstroms, or another suitable thickness value. In yet further embodiments, a thickness of the adhesive liner 122 is, for example, about 20 Angstroms, about 30 Angstroms, within a range of about 20 to 30 Angstroms, or another suitable thickness value. Thus, in some embodiments, a thickness of the first diffusion barrier layer 118 is greater than a thickness of the second diffusion barrier layer 310, and the thickness of the first diffusion barrier layer 118 is less than the thickness of the adhesive liner 122.

In some embodiments, if, for example, the thickness of the second diffusion barrier layer 310 is relatively large (e.g., greater than about 10 Angstroms), then a contact resistance between the conductive via 114 and the lower conductive structure 106 may increase. This, in part, may increase the RC delay of the integrated chip 300b. In further embodiments, if, for example, the thickness of the adhesive liner 122 is relatively thin (e.g., less than about 20 Angstroms), then delamination between the conductive body 120 and the first and/or second diffusion barrier layers 118, 310 may occur. In yet further embodiments, if, for example, the thickness of the adhesive liner 122 is relatively large (e.g., greater than about 30 Angstroms), then a contact resistance between the conductive via 114 and the lower conductive structure 106 may increase. In some embodiments, if, for example, the thickness of the first diffusion barrier layer 118 is relatively thin (e.g., less than about 10 Angstroms), then a diffusion of material (e.g., copper) from the conductive body 120 to adjacent structures may increase. In further embodiments, if, for example, the thickness of the first diffusion barrier layer 118 is relatively large (e.g., greater than about 20 Angstroms), then a width w1 of the bottom surface 120bs of the conductive body 120 may be reduced such that a contact resistance between the conductive via 114 and the lower conductive structure 106 may be increased.

In some embodiments, a ratio between the thickness of the adhesive liner 122 and the thickness of the first diffusion barrier layer 118 is, for example, about 1.5:1, or another suitable value. In further embodiments, if the ratio between the thickness of the adhesive liner 122 and the thickness of the first diffusion barrier layer 118 is relatively low (less than about 1.5:1), then an RC delay of the integrated chip 300b may be increased.

Figure 3C:
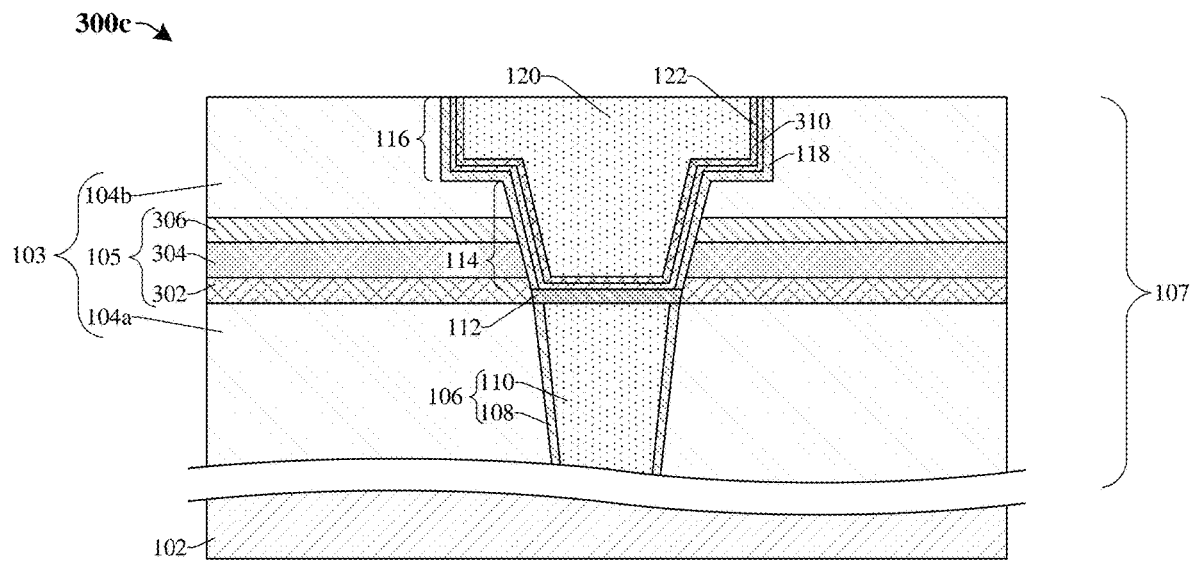

FIG. 3C illustrates a cross-sectional view of some embodiments of an integrated chip 300c corresponding to some alternative embodiments of the integrated chip 300b of FIG. 3B. In some embodiments, the capping layer 112 is disposed within the etch stop structure 105, such that a bottom surface of the capping layer 112 is aligned with a bottom surface of the etch stop structure 105.

Figure 3D:
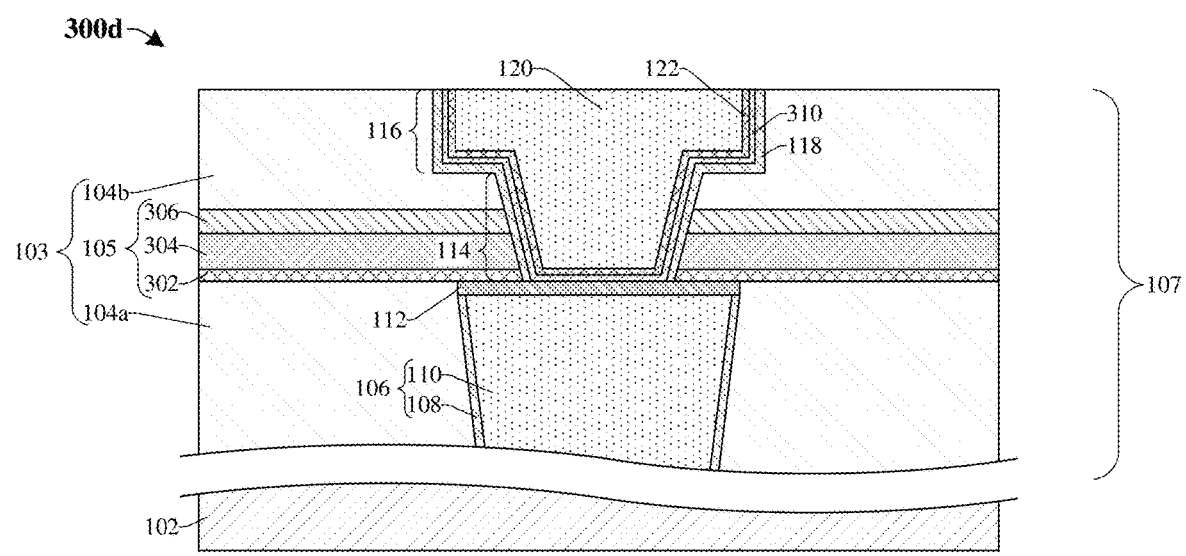

FIG. 3D illustrates a cross-sectional view of some embodiments of an integrated chip 300d corresponding to some alternative embodiments of the integrated chip 300b of FIG. 3B. In some embodiments, a maximum width of the lower conductive structure 106 is greater than a maximum width of the conductive via 114.

Figure 3E:
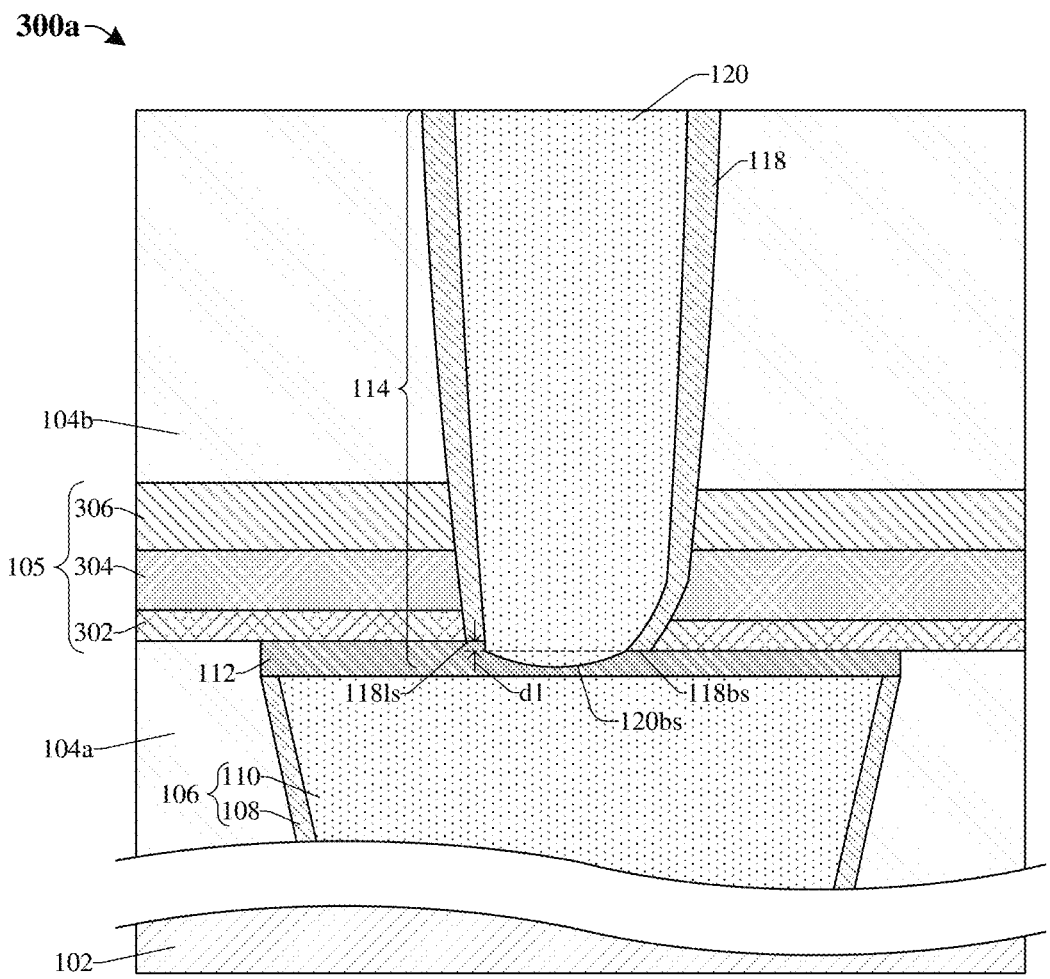

FIG. 3E illustrates a cross-sectional view of some embodiments of a portion of the integrated chip 300a of FIG. 3A. For example, the cross-sectional view of FIG. 3E may be taken from a location of the integrated chip 300a as illustrated by the dashed box in FIG. 3A. In some embodiments, the capping layer (not shown) (e.g., 112 of FIG. 3A) is disposed between the conductive body 120 and the first diffusion barrier layer 118. Further, as illustrated in FIG. 3E, the first diffusion barrier layer 118 has a bottom surface 118bs disposed below a lower surface 118ls by a distance d1. In some embodiments, the distance d1 is non-zero. In further embodiments, opposing sidewalls of the diffusion barrier layer 118 are slanted and/or curved, such that layers within the etch stop structure 105 conform to the slanted and/or curved sidewalls of the diffusion barrier layer 118.

Figure 4A:
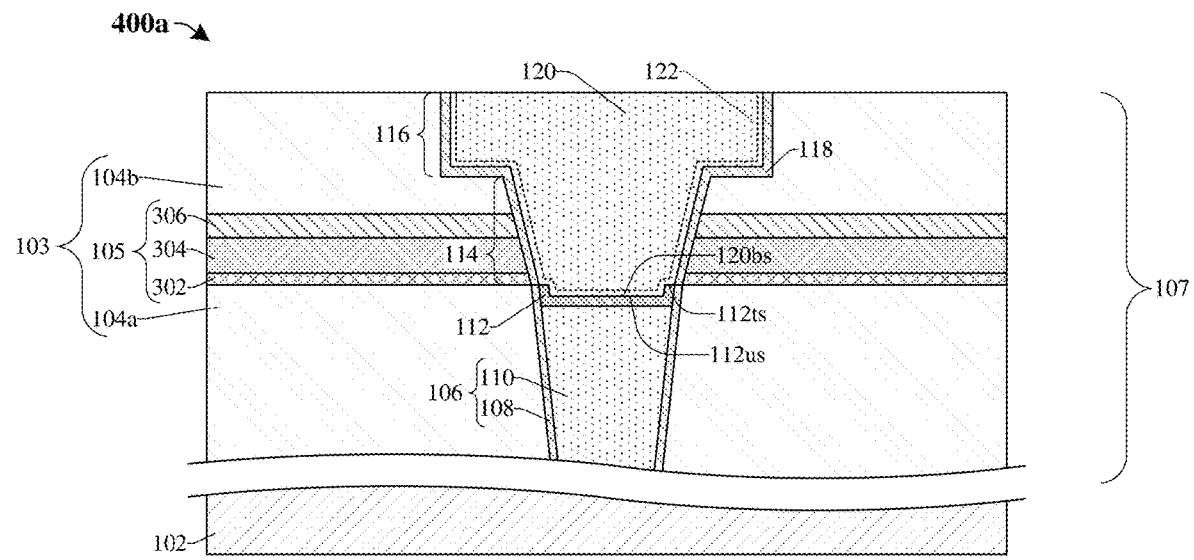

FIG. 4A illustrates a cross-sectional view of some embodiments of an integrated chip 400a having an interconnect structure 107 over a semiconductor substrate 102.

In some embodiments, the capping layer 112 has a U-shape, such that the capping layer 112 is disposed between inner sidewalls of the lower conductive liner 108. Thus, the capping layer 112 may have an upper surface 112us that is vertically below a top surface 112ts of the capping layer 112. In further embodiments, the bottom surface 120bs of the conductive body 120 is disposed below a top surface of the first ILD layer 104a.

Figure 4B:
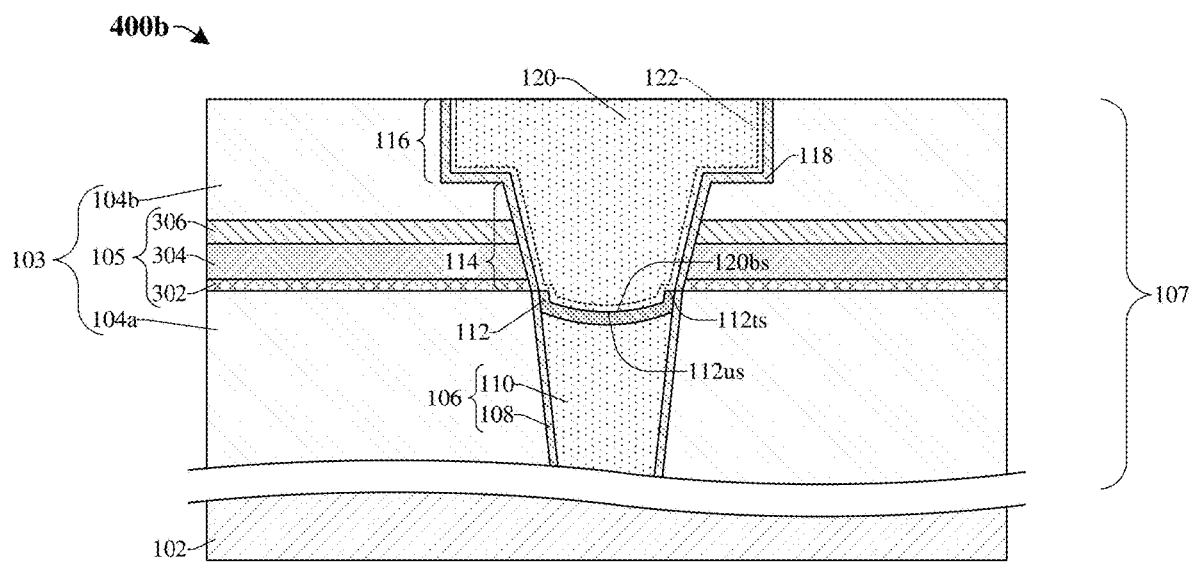

FIG. 4B illustrates a cross-sectional view of some embodiments of an integrated chip 400b corresponding to some alternative embodiments of the integrated chip 400a of FIG. 4A. In some embodiments, the bottom surface 120bs of the conductive body 120 is curved and/or convex, such that the conductive body 120 conforms to a shape of the upper surface 112us of the capping layer 112. In such embodiments, a bottom surface of the adhesive liner 122 may be curved, thereby conforming to the shape of the upper surface 112us of the capping layer 112.

Figure 4C:
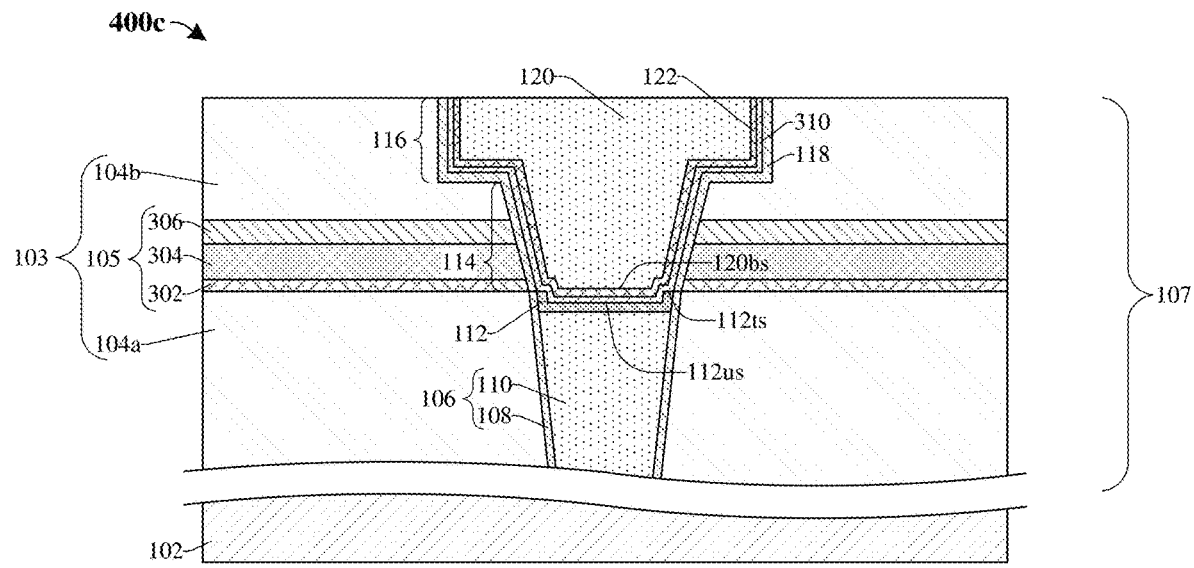

FIG. 4C illustrates a cross-sectional view of some embodiments of an integrated chip 400c corresponding to some alternative embodiments of the integrated chip 400a of FIG. 4A. In some embodiments, the second diffusion barrier layer 310 is disposed between the first diffusion barrier layer 118 and the adhesive liner 122. In further embodiments, the second diffusion barrier layer 310 continuously extends from the top surface 112ts of the capping layer 112 to the upper surface 112us of the capping layer 112, such that a bottom surface of the second diffusion barrier layer 310 is disposed vertically below the top surface 112ts of the capping layer 112.

Figure 4D:
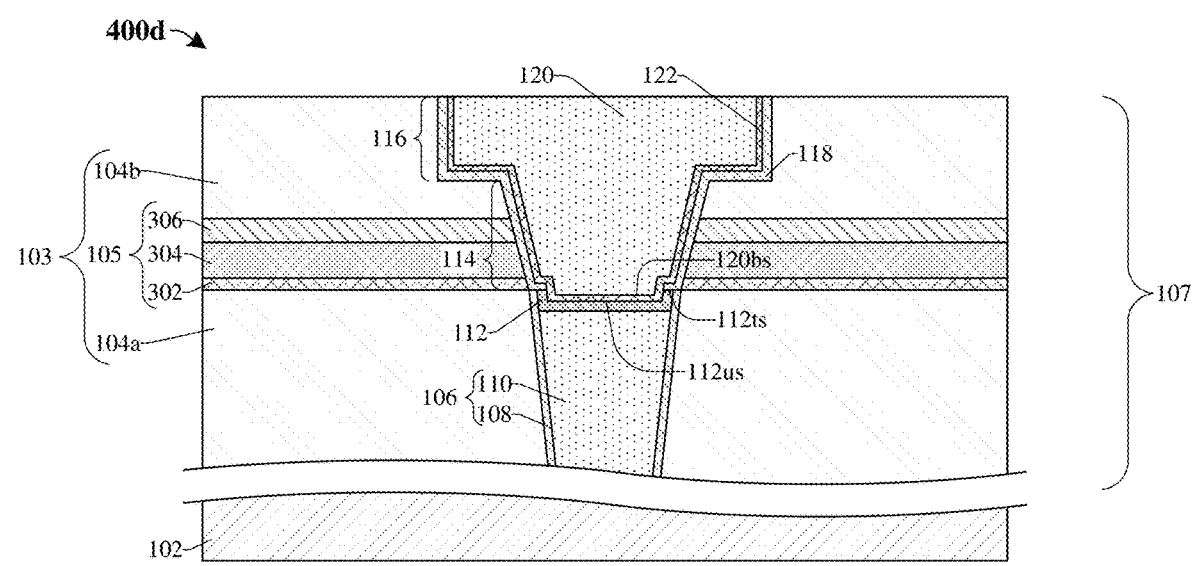

FIG. 4D illustrates a cross-sectional view of some embodiments of an integrated chip 400d corresponding to some alternative embodiments of the integrated chip 400c of FIG. 4C, in which the second diffusion barrier layer (310 of FIG. 4C) is omitted. In such embodiments, a contact resistance between the conductive via 114 and the lower conductive structure 106 is reduced, thereby decreasing an RC delay in the integrated chip 400d. In further embodiments, the adhesive liner 122 continuously extends from the top surface 112ts of the capping layer 112 to the upper surface 112us of the capping layer 112.

Figure 5A:
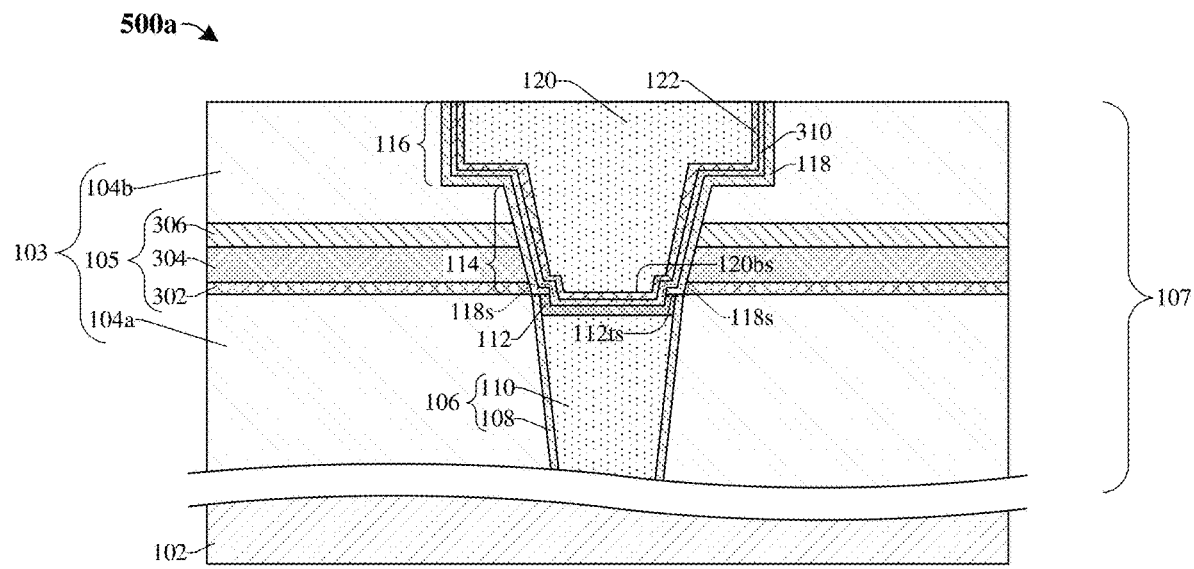

FIG. 5A illustrates a cross-sectional view of some embodiments of an integrated chip 500a corresponding to some alternative embodiments of the integrated chip 400c of FIG. 4C, in which the first diffusion barrier layer 118 comprises a segment 118s that continuously extends from a top surface of the lower conductive liner 108 to the top surface 112ts of the capping layer 112.

Figure 5B:
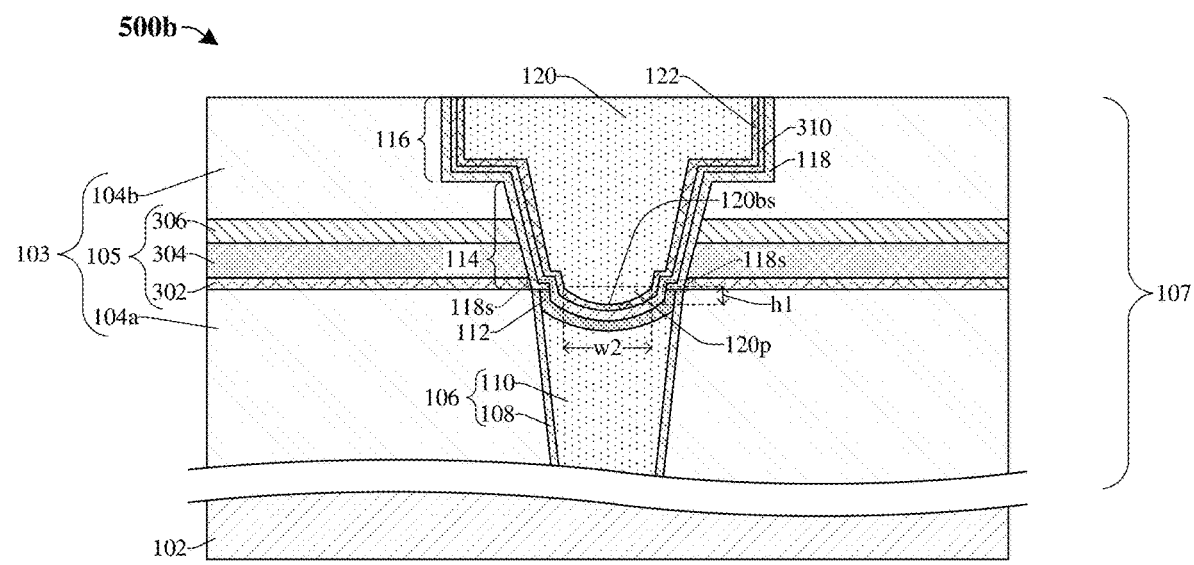

FIG. 5B illustrates a cross-sectional view of some embodiments of an integrated chip 500b corresponding to some alternative embodiments of the integrated chip 500a of FIG. 5A, in which the bottom surface 120bs of the conductive body 120 is curved such that a bottommost point of the conductive body is disposed vertically below the segment 118s of the first diffusion barrier layer 118.

Further, as illustrated in FIG. 5B, the conductive body 120 comprises a protrusion 120p that extends below a bottom surface of the etch stop structure 105. In such embodiments, the protrusion 120p has a width w2 and a height h1. In various embodiments, a ratio between the width w2 and the height h1 (e.g., w2:h1) is, for example, within a range of about 5:1 to 15:1, or another suitable value. In further embodiments, if the ratio w2:h1 is relatively small (e.g., less than about 5:1), then too much conductive material may be removed from the lower conductive body 110 during fabrication, thereby increasing a contact resistance between the conductive via 114 and the lower conductive body 110. In yet further embodiments, if the ratio w2:h1 is relatively large (e.g., greater than about 15:1), then dielectric material may not be completely removed from an upper surface of the lower conductive body 110 during fabrication, thereby increasing a contact resistance between the conductive via 114 and the lower conductive body 110.

Figure 6:
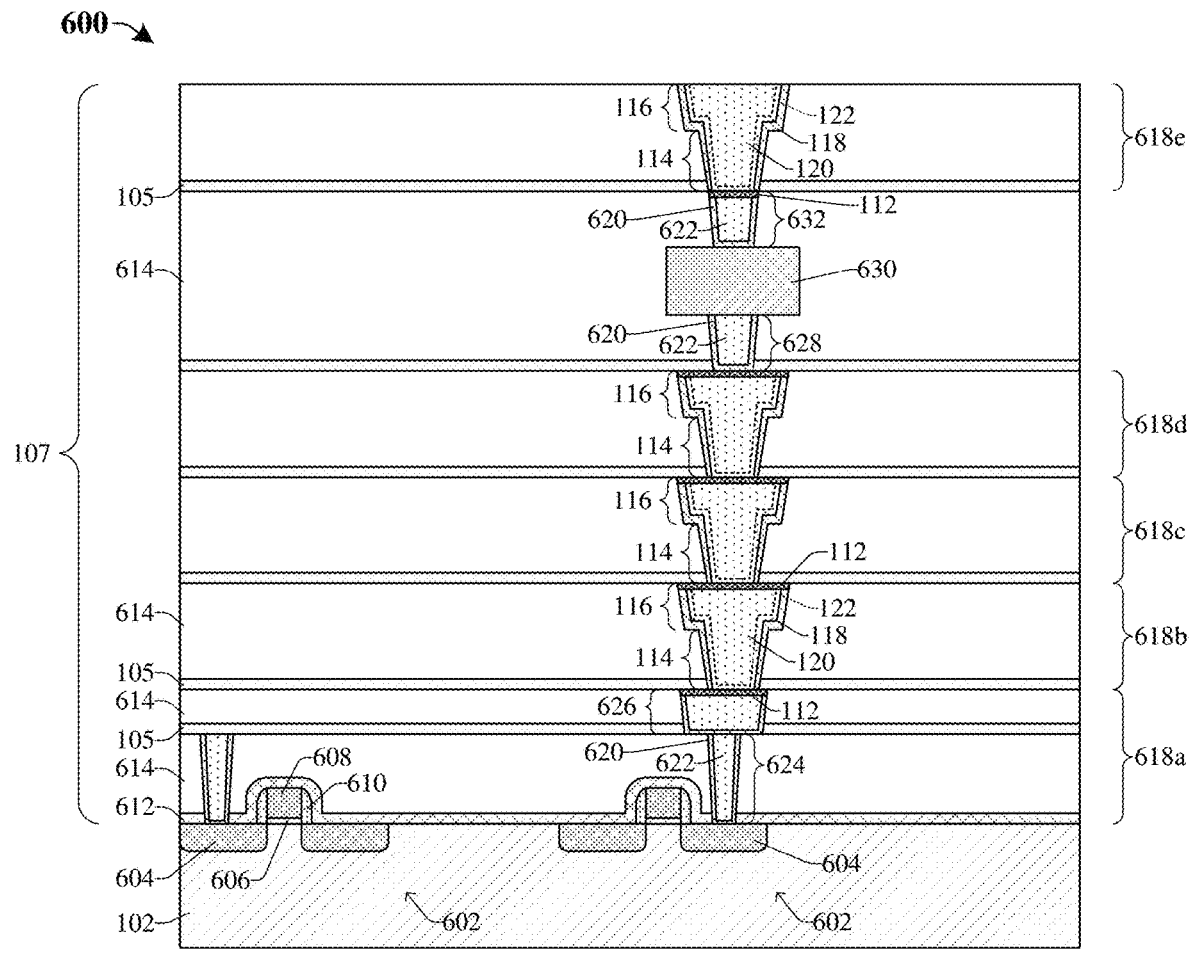
FIG. 6 illustrates a cross-sectional view of some embodiments of an integrated chip having an interconnect structure overlying a substrate, where the interconnect structure comprises a plurality of metallization layers comprising a diffusion barrier layer configured to reduce contact resistance.

FIG. 6 illustrates a cross-sectional view of some embodiments of an integrated chip 600 having an interconnect structure 107 overlying a semiconductor substrate 102, where the interconnect structure 107 comprises a plurality of metallization layers 618a-e.

The integrated chip 600 includes transistors 602 disposed within and/or on the semiconductor substrate 102. In some embodiments, the transistors 602 may be configured as metal-oxide-semiconductor field effect transistors (MOSFETs), complementary metal-oxide-semiconductor (CMOS) transistors, bipolar junction transistors (BJTs), laterally diffused metal-oxide-semiconductor (LDMOS) transistors, high power metal-oxide-semiconductor transistors, any combination of the foregoing, or another type of transistor. In some embodiments, the semiconductor substrate 102 may, for example, be a bulk silicon substrate, a silicon-on-insulator (SOI) substrate, or some other semiconductor substrate and/or may comprise a first doping type (e.g., p-type). In further embodiments, the transistors 602 each comprise source/drain regions 604, a gate dielectric layer 606, a gate electrode 608, and a sidewall spacer structure 610. In some embodiments, the source/drain regions 604 are disposed on opposite sides of the gate electrode 608 and comprise a second doping type (e.g., n-type) opposite the first doping type.

The interconnect structure 107 overlies the semiconductor substrate 102. In some embodiments, the interconnect structure 107 includes an interconnect dielectric structure and the plurality of metallization layers 618a-e. In some embodiments, the interconnect dielectric structure includes a contact etch stop layer (CESL) 612, inter-level dielectric (ILD) layers 614, and etch stop structures 105. The metallization layers 618a-e are configured to electrically couple semiconductor devices disposed within the integrated chip 600 together. In further embodiments, the metallization layers 618a-e respectively comprise one or more conductive features. For example, a first metallization layer 618a may comprise bottommost conductive via(s) 624 and/or bottommost conductive wire(s) 626, such that the first metallization layer 618a is a bottommost metallization layer of the interconnect structure 107. In some embodiments, the bottommost conductive via(s) and/or wire(s) 624, 626 respectively comprise a conductive body structure 622 and a conductive liner 620. In some embodiments, the conductive body structure 622 may, for example, be or comprise aluminum, copper, a combination of the foregoing, or the like. In further embodiments, the conductive liner 620 may, for example, be or comprise tantalum nitride, titanium nitride, or the like. Further, the capping layer 112 may be disposed along an upper surface of the bottommost conductive wire(s) 626 disposed within the first metallization layer 618a.

Upper metallization layers 618b-e overlie the first metallization layer 618a and may each comprise a conductive wire 116 overlying a conductive via 114. In some embodiments, the conductive wire 116 and the conductive via 114 include a first diffusion barrier layer 118 that laterally encloses a conductive body 120. Further, an adhesive liner 122 is disposed between the first diffusion barrier layer 118 and the conductive body 120. In some embodiments, the conductive via and wire 114, 116 disposed within the upper metallization layers 618b-e may respectively be configured as the conductive via and wire 114, 116 illustrated and described in FIGS. 1, 3A-3D, 4A-4D, and 5A-5B. Thus, a contact resistance between conductive features within the interconnect structure 107 may be reduced, thereby decreasing an RC delay in the integrated chip 600. In yet further embodiments, a semiconductor device 630 is disposed within the interconnect structure 107 between upper metallization layers 618d, 618e. In some embodiments, the semiconductor device 630 may be disposed between a bottom electrode via 628 and a top electrode via 632. In some embodiments, the semiconductor device 630 may be configured as a memory cell, such as a resistive random-access memory (RRAM) cell, a magnetoresistive random-access memory (MRAM) cell, or another suitable memory cell, a thin film resistor, or another semiconductor device. Thus, by virtue of the first diffusion barrier layer 118 reducing the RC delay within the integrated chip 600, a performance of the semiconductor device 630 is increased.

FIGS. 7-15 illustrate cross-sectional views 700-1500 of some embodiments of a first method of forming an interconnect structure having a conductive via and a conductive wire with a diffusion barrier layer overlying a lower conductive structure according to the present disclosure. Although the cross-sectional views 700-1500 shown in FIGS. 7-15 are described with reference to a method, it will be appreciated that the structures shown in FIGS. 7-15 are not limited to the method but rather may stand alone separate of the method. Furthermore, although FIGS. 7-15 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 7:
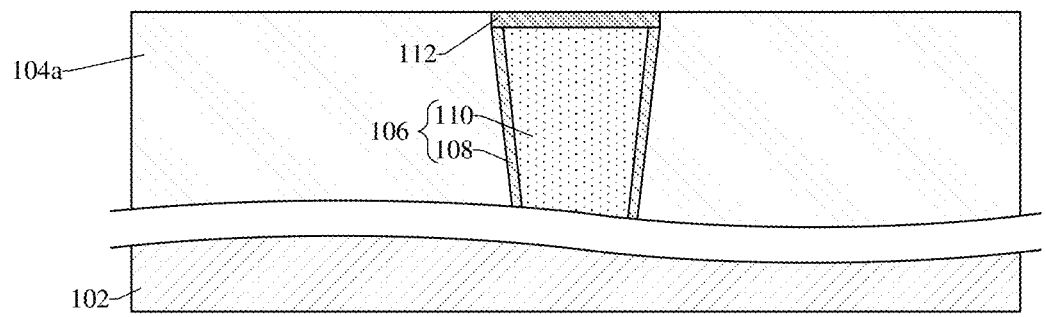
FIGS. 7-15 illustrate cross-sectional views of some embodiments of a first method of forming a conductive via and a conductive wire with a diffusion barrier layer configured to decrease contact resistance.

As shown in cross-sectional view 700 of FIG. 7, a lower conductive structure 106 is formed over a semiconductor substrate 102. In some embodiments, the semiconductor substrate 102 may, for example, be or comprise a bulk substrate (e.g., a bulk silicon substrate), a silicon-on-insulator (SOI) substrate, or another suitable material. In further embodiments, the lower conductive structure 106 includes a lower conductive body 110 and a lower conductive liner 108 laterally surrounding the lower conductive body 110. In some embodiments, the lower conductive liner 108 may be configured as a diffusion barrier layer and/or may, for example, be or comprise titanium nitride, tantalum nitride, or the like. Further, a capping layer 112 is formed along an upper surface of the lower conductive body 110, such that the capping layer 112 and the lower conductive structure 106 are both disposed within a first inter-level dielectric (ILD) layer 104a. In some embodiments, the lower conductive structure 106 may be formed by a dual damascene process or a single damascene process. In some embodiments, the capping layer 112 may, for example, be or comprise cobalt, ruthenium, tungsten, a metal comprising one or more dopants, or the like and/or may be deposited by chemical vapor deposition (CVD), physical vapor deposition (PVD), sputtering, electroless plating, electro plating, or another suitable growth or deposition process. In further embodiments, the capping layer 112 may be formed to a thickness within a range of about 20 to 30 Angstroms.

In some embodiments, a single damascene process for forming the lower conductive structure 106 may include: depositing the first ILD layer 104a (e.g., by CVD, PVD, atomic layer deposition (ALD), etc.) over the semiconductor substrate 102; patterning the first ILD layer 104a to define a lower conductive feature opening within the first ILD layer 104a; depositing (e.g., by CVD, PVD, sputtering, electroless plating, etc.) a liner layer within the conductive feature opening and depositing (e.g., by CVD, PVD, sputter, electroless plating, etc.) a conductive material over the liner layer, thereby filling the lower conductive feature opening; and performing a planarization process (e.g., a chemical mechanical planarization (CMP) process) into the conductive material and/or liner layer until an upper surface of the first ILD layer 104a is reached, thereby defining the lower conductive body 110 and the lower conductive liner 108. In further embodiments, after forming the lower conductive structure 106, a baking process may be performed on the structure of FIG. 7 to remove moisture between the first ILD layer 104a and the lower conductive structure 106. In yet further embodiments, the lower conductive structure 106 may be formed by a dual damascene process. Further, the lower conductive structure 106 may be a first conductive wire overlying a first conductive via (not shown) disposed within a first metallization layer (e.g., 618a of FIG. 6) overlying the semiconductor substrate 102. In further embodiments, the first ILD layer 104a may, for example, be or comprise silicon dioxide, a low-k dielectric material, an extreme low-k dielectric material, any combination of the foregoing, or the like.

Figure 8:
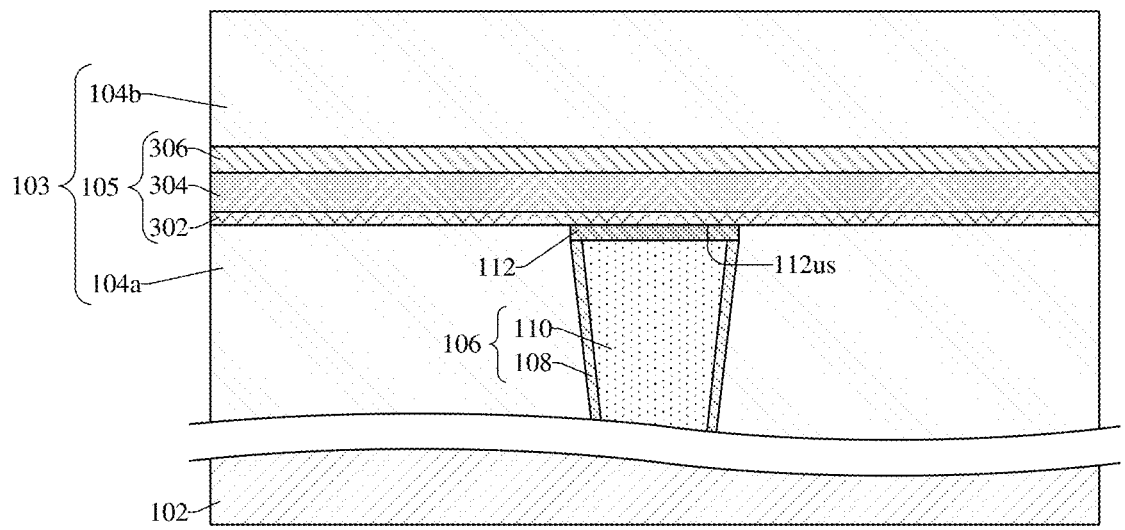

As shown in cross-sectional view 800 of FIG. 8, an etch stop structure 105 is formed over the first ILD layer 104*a* and a second ILD layer 104*b* is formed over the etch stop structure 105. In some embodiments, the etch stop structure 105 includes a lower etch stop layer 302, a middle dielectric layer 304, and an upper etch stop layer 306. In some embodiments, the lower etch stop layer 302 and the upper etch stop layer 306 may, for example, respectively be or comprise silicon carbide, silicon nitride, silicon oxynitride, any combination of the foregoing, or the like. In further embodiments, the middle dielectric layer 304 may, for example, be or comprise silicon dioxide, silicon nitride, silicon carbide, or the like. In some embodiments, the layers of the etch stop structure 105 and the second ILD layer 104*b* may, for example, respectively be deposited by PVD, CVD, ALD, or another suitable deposition process. In some embodiments, the second ILD layer 104*b* may, for example, be or comprise silicon dioxide, a low-k dielectric material, an extreme low-k dielectric material, or another suitable dielectric material.

Figure 9:
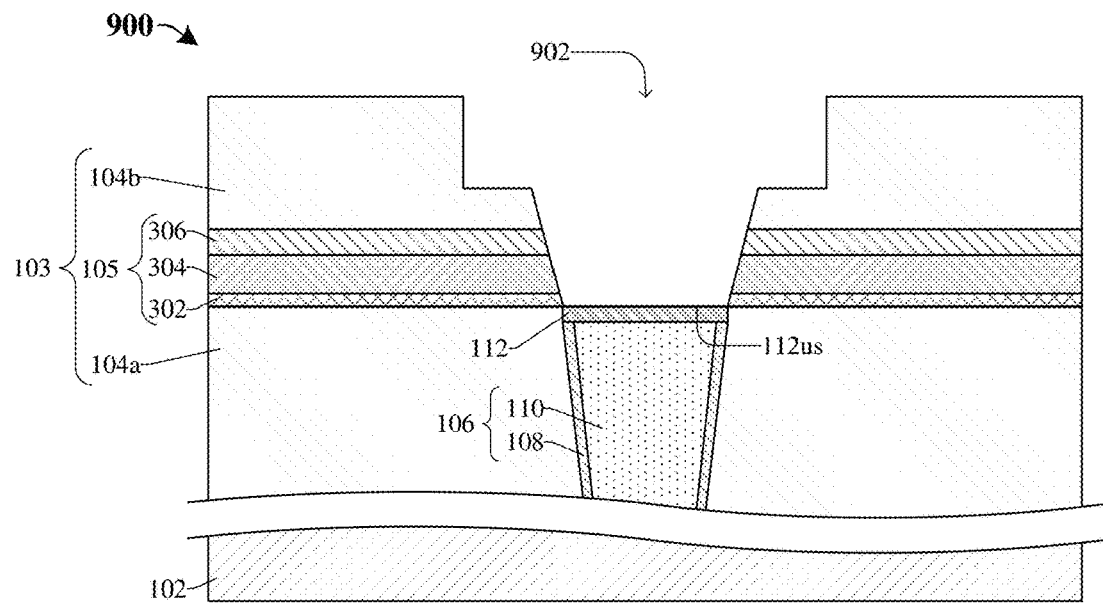

As shown in cross-sectional view 900 of FIG. 9, a patterning process is performed on the second ILD layer 104*b* and the etch stop structure 105, thereby defining a metallization opening 902. In some embodiments, the metallization opening 902 includes a first opening for a first conductive feature (e.g., a conductive via) underlying a second opening for a second conductive feature (e.g., a conductive wire). In further embodiments, the patterning process may include: forming a masking layer (not shown) over the second ILD layer 104*b*; performing an etch process on the second ILD layer 104*b* and the etch stop structure 105 according to the masking layer, thereby defining the metallization opening 902 and exposing an upper surface 112*us* of the capping layer 112; and performing a removal process to remove the masking layer.

Figure 10A:
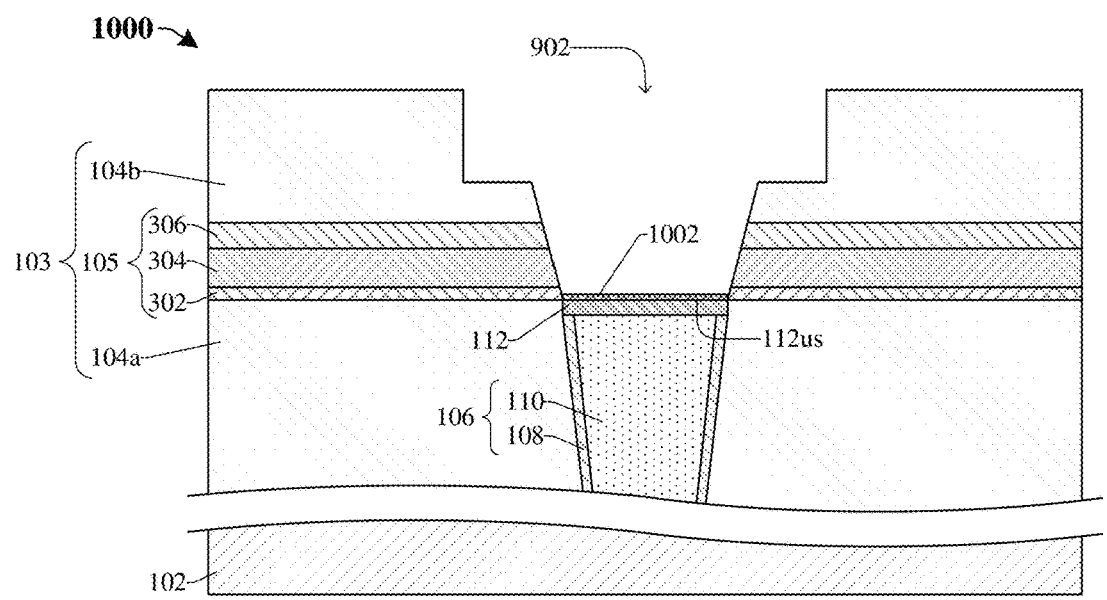

As shown in cross-sectional view 1000 of FIG. 10A, a self-assembled monolayer (SAM) 1002 is selectively deposited on the upper surface 112*us* of the capping layer 112. In some embodiments, the SAM 1002 comprises a head group that adheres or bonds to the capping layer 112 but not to the second ILD layer 104*b* and/or layers within the etch stop structure 105. In some embodiments, the SAM 1002 may be deposited onto the capping layer 112 by spin coating. In further embodiments, a process for forming the SAM 1002 includes spinning the SAM 1002 onto the structure of FIG. 9, upon being spun onto the structure of FIG. 9 the SAM 1002 will adhere to the capping layer 112 but not to the second ILD layer 104*b* and/or the etch stop structure 105.

Figure 10B:
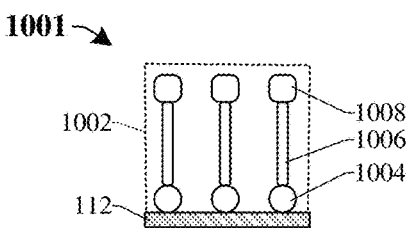

As shown in cross-sectional view 1001 of FIG. 10B, in some embodiments, the SAM 1002 is formed over the capping layer 112 in such a manner that the SAM 1002 comprises a head group 1004 connected to a terminal group 1008 (i.e., function group) by way of a molecular chain 1006 (i.e., tail). The head group 1004 has a hydrophilic interfacial property that causes the SAM 1002 to be attracted the capping layer 112. In some embodiments, the head group 1004 may comprise sulfhydryl, thiol, or a nitride, which provide the hydrophilic interfacial property. In further embodiments, the molecular chain 1006 may, for example, comprise an alkyl chain, such as methylene $(CH_2)_n$. The terminal group 1008 has a hydrophobic interfacial property that repels metal, thereby preventing metal from adhering to the SAM 1002. In some embodiments, the terminal group 1008 may comprise a methyl group $(CH_3)$, which provides the hydrophobic interfacial property.

Figure 11:
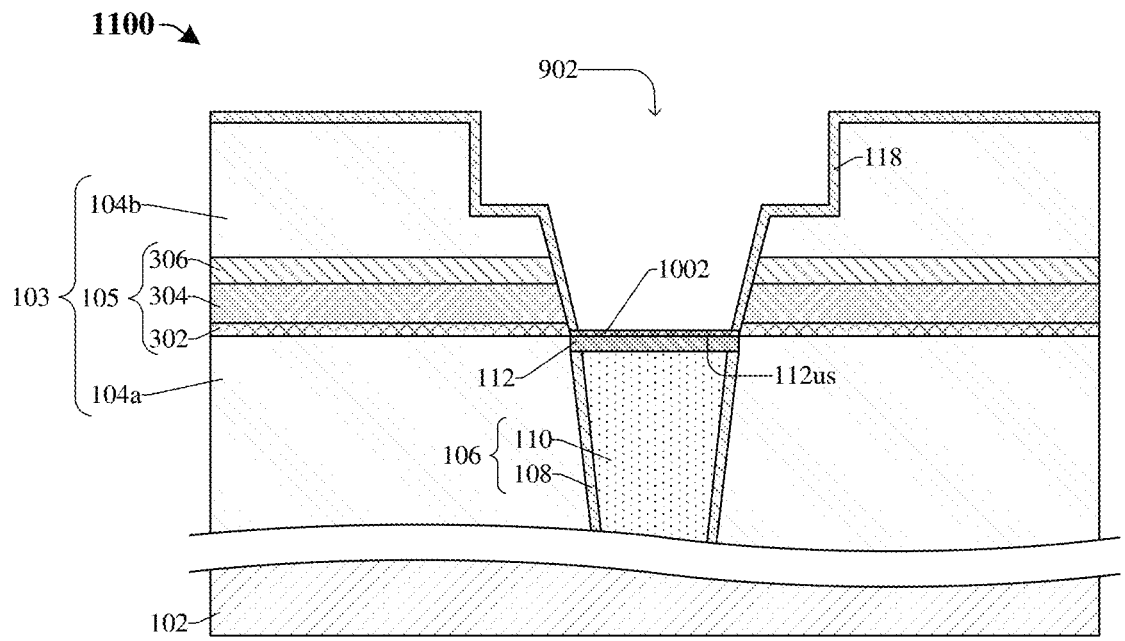

As shown in cross-sectional view 1100 of FIG. 11, a first diffusion barrier layer 118 is formed over the second ILD layer 104*b* and the etch stop structure 105. In some embodiments, the first diffusion barrier layer 118 lines sidewalls of the second ILD layer 104*b* and the etch stop structure 105 defining the metallization opening 902. In some embodiments, the first diffusion barrier layer 118 may, for example, be or comprise tantalum nitride, titanium nitride, or the like and/or may be formed to a thickness of about 18 Angstroms, 10 Angstroms, 15 Angstroms, 20 Angstroms, or within a range of about 10 to 20 Angstroms. In further embodiments, the first diffusion barrier layer 118 may be deposited by ALD. In some embodiments, the terminal group (1008 of FIG. 10B) of the SAM 1002 comprises the hydrophobic surface which prevents the first diffusion barrier layer 118 (e.g., tantalum nitride) from adhering or bonding to the SAM 1002. Thus, in some embodiments, the SAM 1002 is configured to prevent and/or block deposition of the first diffusion barrier layer 118 on the upper surface of the SAM 1002 such that the first diffusion barrier layer 118 may be selectively deposited in areas in which the SAM 1002 is not located.

Figure 12:
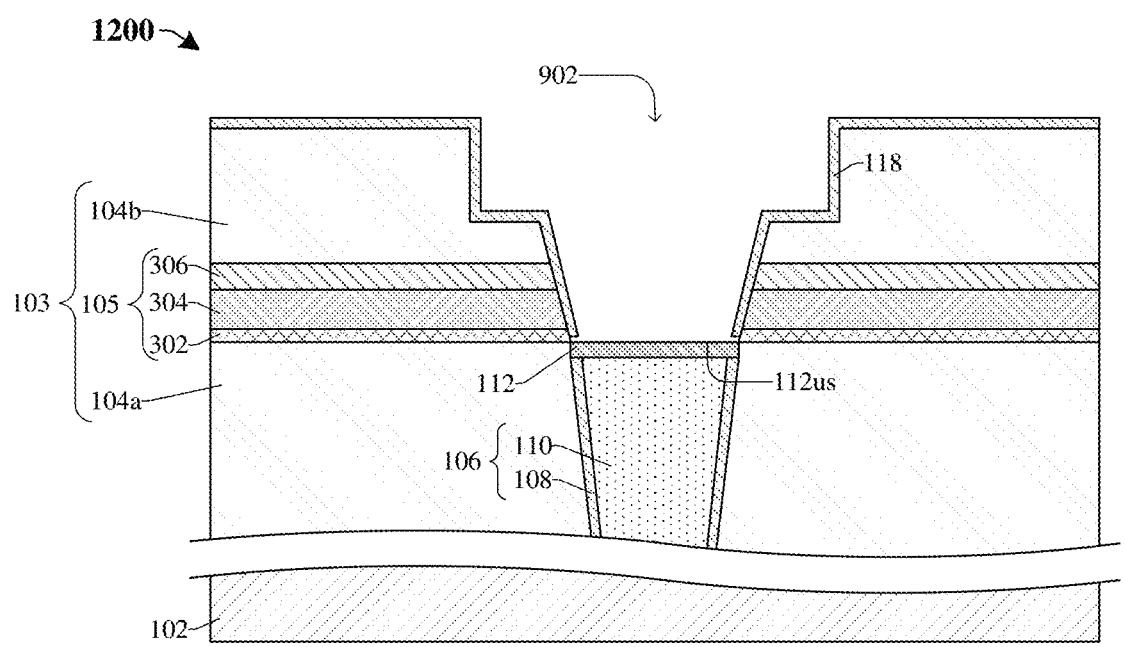

As shown in cross-sectional view 1200 of FIG. 12, a removal process is performed to remove the SAM (1002 of FIG. 11) from the upper surface 112*us* of the capping layer 112. In some embodiments, the removal process includes exposing the structure of FIG. 11 to a removal plasma (e.g., hydrogen $(H_2)$) that is configured to remove the SAM (1002 of FIG. 11).

Figure 13:
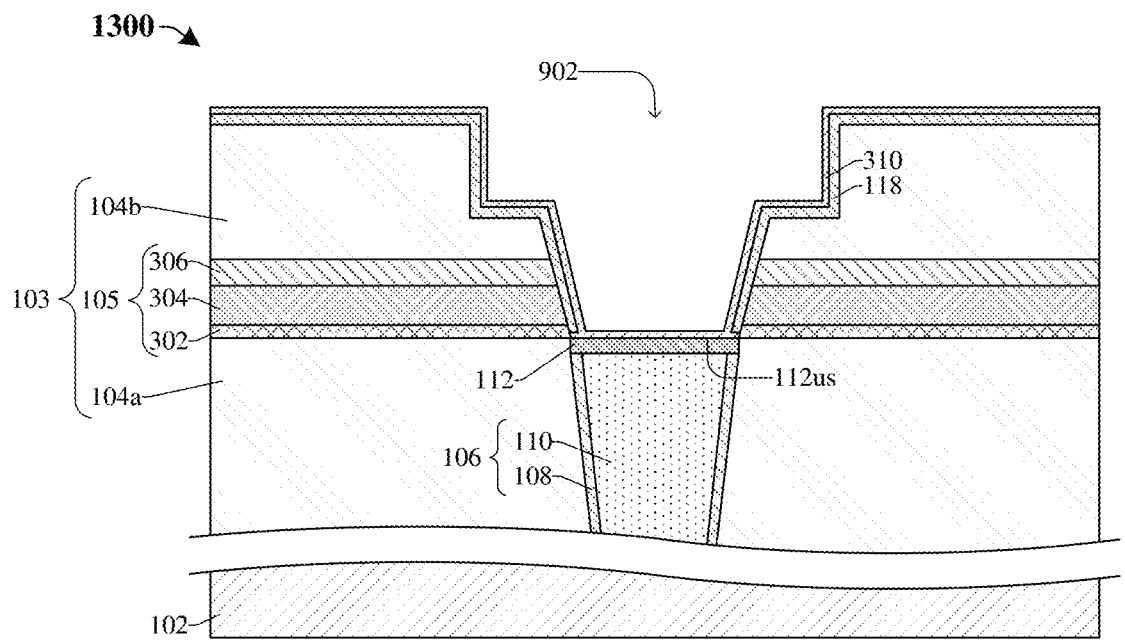

As shown in cross-sectional view 1300 of FIG. 13, a second diffusion barrier layer 310 is formed over the first diffusion barrier layer 118 and the capping layer 112. In some embodiments the second diffusion barrier layer 310 may, for example, be or comprise titanium nitride, tantalum nitride, or the like and/or may be formed to a thickness of about 1 Angstrom, 5 Angstroms, or within a range of about 1 to 10 Angstroms. In further embodiments, the second diffusion barrier layer 310 may be deposited by PVD.

In further embodiments, the deposition of second diffusion barrier layer 310 illustrated in FIG. 13 is omitted, such that the second diffusion barrier layer 310 does not overlie the capping layer 112, see for example FIGS. 1 and 3A. In such embodiments, the processing step of FIG. 13 is skipped, such that the first method may flow from FIGS. 7-12 to FIGS. 14-15.

Figure 14:
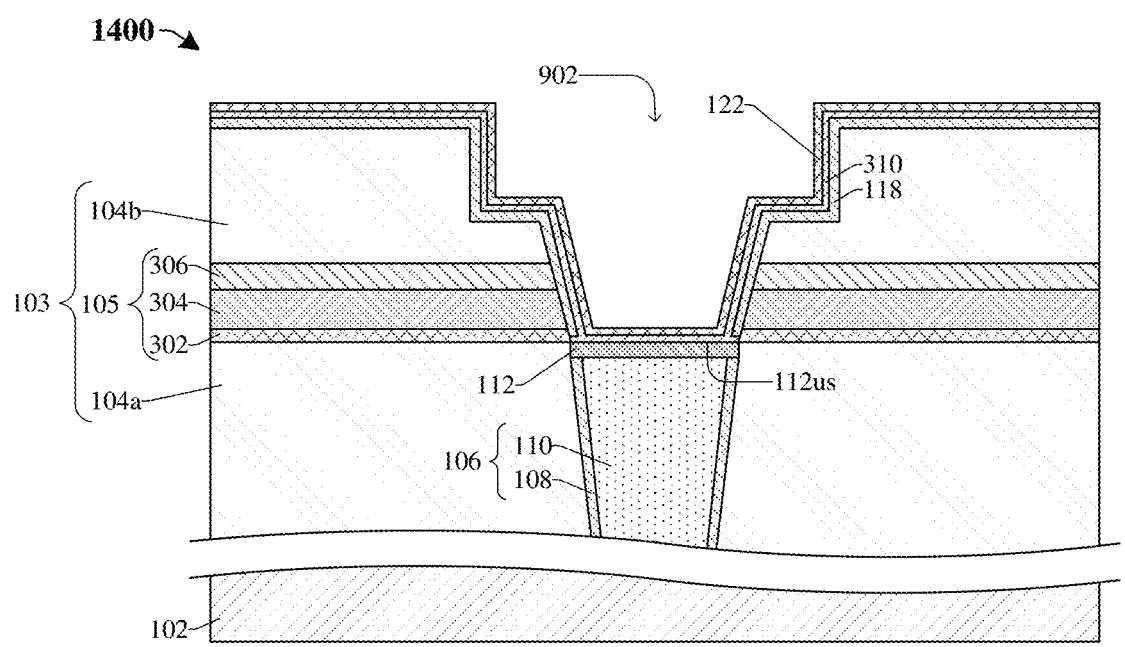

As shown in cross-sectional view 1400 of FIG. 14, an adhesive liner 122 is formed over the second diffusion barrier layer 310. In some embodiments, the adhesive liner 122 may, for example, be or comprise cobalt, ruthenium, tungsten, a metal comprising one or more dopants, or another suitable material and/or may be formed to a thickness within a range of about 20 to 30 Angstroms. In some embodiments, the adhesive liner 122 may, for example, be deposited by CVD, ALD, or another suitable deposition or growth process. In some embodiments, the adhesive liner 122 may comprise a same material as the capping layer 112.

Figure 15:
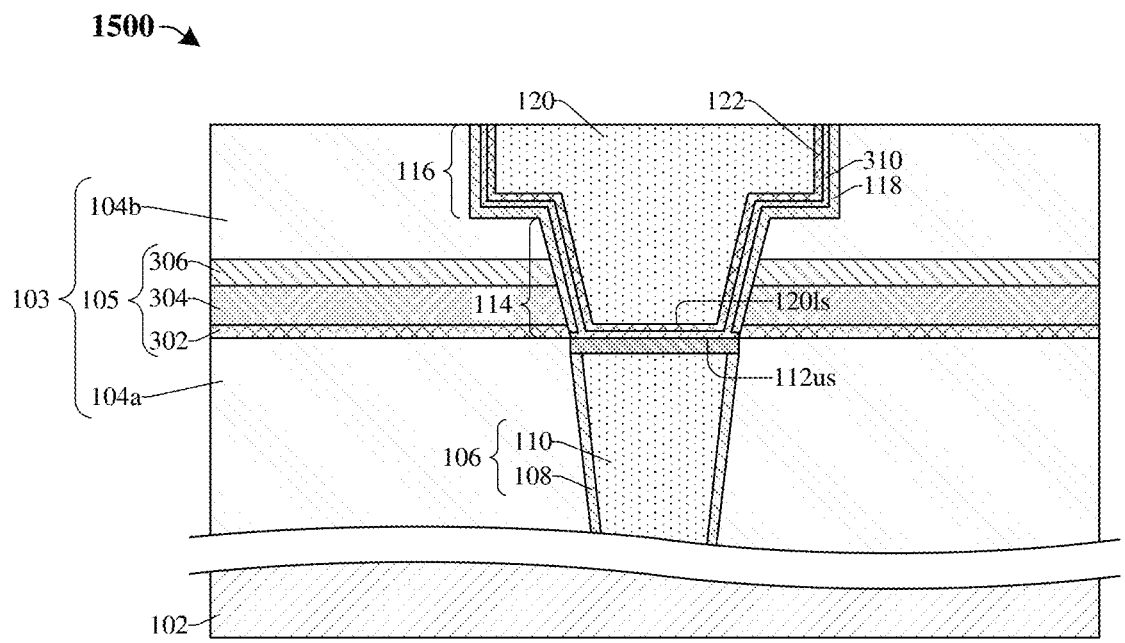

As shown in cross-sectional view 1500 of FIG. 15, a conductive body 120 is formed over the adhesive liner 122, thereby defining a conductive via 114 and a conductive wire 116. In some embodiments, a process for forming the conductive body 120 incudes: depositing (e.g., by CVD, PVD, sputtering, electroless plating, electroplating (ECP), etc.) a conductive material (e.g., copper, aluminum, copper manganese, ruthenium, another suitable conductive material, or any combination of the foregoing) within the metallization opening (902 of FIG. 14); and performing a planarization process (e.g., a chemical mechanical planarization (CMP) process) into the conductive material, the adhesive liner 122, the first diffusion barrier layer 118, and the second diffusion barrier layer 310 until an upper surface of the second ILD layer 104b is reached, thereby defining the conductive body 120. In some embodiments, the deposition process may include first depositing a conductive seed layer (e.g., a copper seed layer) and then depositing the conductive material over the conductive seed layer by, for example, ECP. In such embodiments, the conductive seed layer and the conductive material may comprise a same material (e.g., copper). In yet further embodiments, a baking process may be performed on the conductive material before performing the planarization process. In some embodiments, the baking process may reach a temperature within a range of about 250 to 345 degrees Celsius.

FIGS. 16-24 illustrate cross-sectional views 1600-2400 of some embodiments of a second method of forming an interconnect structure having a conductive via and a conductive wire with a diffusion barrier layer overlying a lower conductive structure according to the present disclosure. Although the cross-sectional views 1600-2400 shown in FIGS. 16-24 are described with reference to a method, it will be appreciated that the structures shown in FIGS. 16-24 are not limited to the method but rather may stand alone separate of the method. Furthermore, although FIGS. 16-24 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 16:
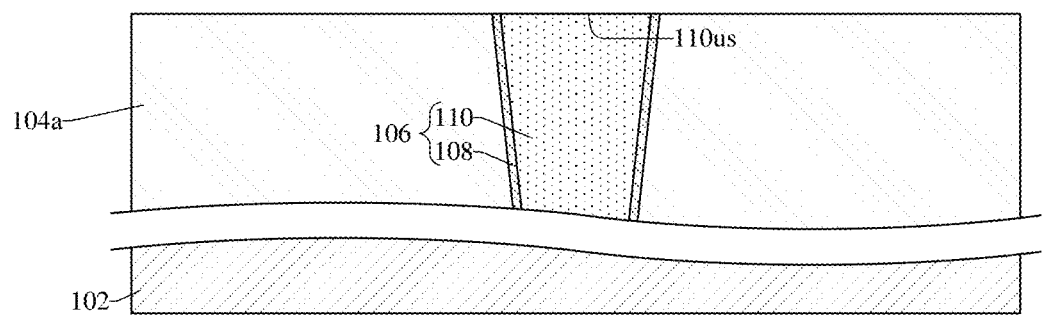
FIGS. 16-24 illustrate cross-sectional views of some embodiments of a second method of forming a conductive via and a conductive wire with a diffusion barrier layer configured to decrease contact resistance.

As shown in cross-sectional view 1600 of FIG. 16, a lower conductive structure 106 is formed over the semiconductor substrate 102. In some embodiments, the lower conductive structure 106 may be formed as illustrated and described in the cross-sectional view 700 of FIG. 7, such as by a single damascene process. In further embodiments, the lower conductive structure 106 may be formed by a dual damascene process. In yet further embodiments, an upper surface 110us of the lower conductive body 110 is aligned with an upper surface of the first ILD layer 104a.

Figure 17:
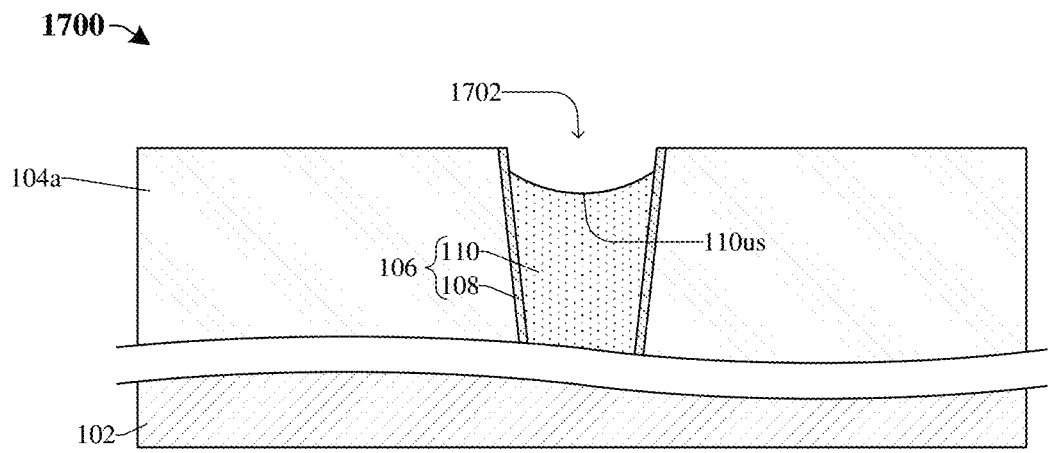

As shown in cross-sectional view 1700 of FIG. 17, an etch process is performed to remove at least a portion of the lower conductive body 110, thereby defining an opening 1702. In some embodiments, after performing the etch process the upper surface 110us of the lower conductive body 110 is U-shaped and disposed below the upper surface of the first ILD layer 104a. In some embodiments, the etch process is a wet etch process in which the lower conductive body 110 is etched at a faster rate than the lower conductive liner 108.

Figure 18:
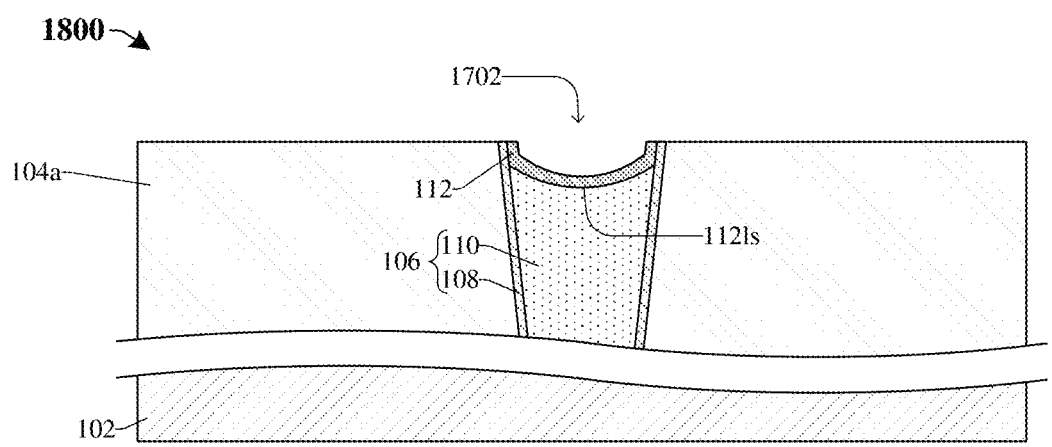

As shown in cross-sectional view 1800 of FIG. 18, the capping layer 112 is formed over the lower conductive body 110 of the lower conductive structure 106. In some embodiments, the capping layer 112 at least partially lines the opening 1702. In further embodiments, a process for forming the capping layer 112 includes: depositing (e.g., by CVD, PVD, sputtering, etc.) a capping film (e.g., cobalt) over the lower conductive structure 106 and the first ILD layer 104a; and performing a planarization process (e.g., a CMP process) into the capping film until an upper surface of the first ILD layer 104a is reached, thereby defining the capping layer 112. In some embodiments, the capping layer 112 conforms to the upper surface of the lower conductive body 110, such that a lower surface 112ls of the capping layer 112 is U-shaped and/or rounded. In some embodiments, the capping layer 112 is solely deposited by CVD. In further embodiments, the capping layer 112 may be formed to a thickness within a range of about 20 to 30 Angstroms.

Figure 19:
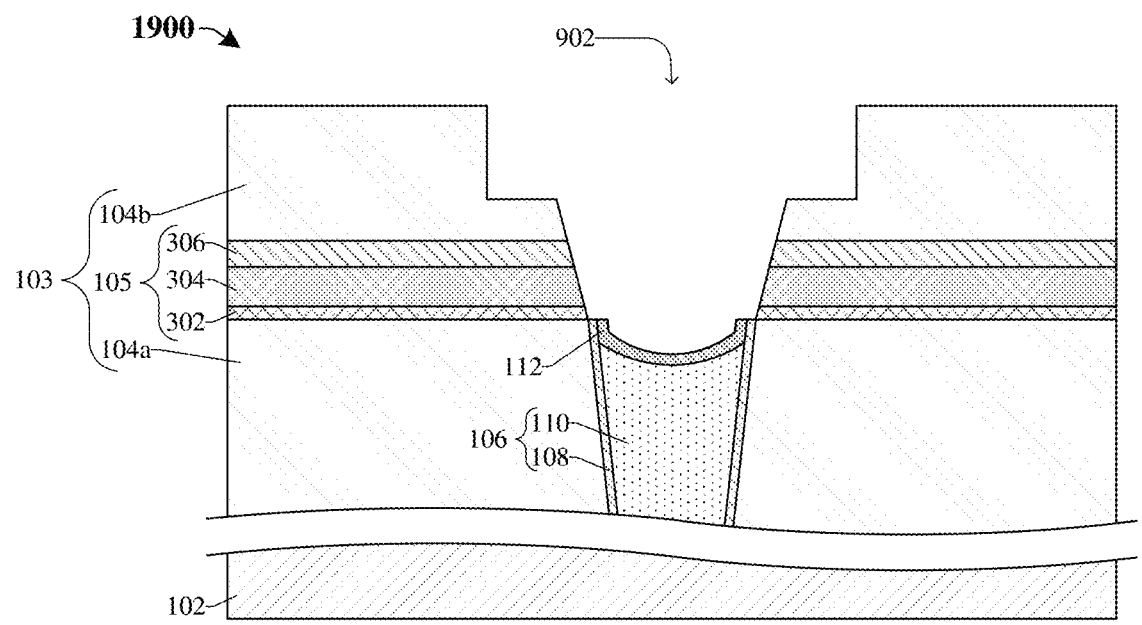

As shown in cross-sectional view 1900 of FIG. 19, the etch stop structure 105 and the second ILD layer 104b are formed over the first ILD layer 104a and the capping layer 112. In some embodiments, the etch stop structure 105 and the second ILD layer 104b may be formed as illustrated and/or described in FIG. 8. Subsequently, a patterning process is performed into the etch stop structure 105 and the second ILD layer 104b thereby defining a metallization opening 902. In some embodiments, the metallization opening 902 includes a first opening for a first conductive feature (e.g., a conductive via) underlying a second opening for a second conductive feature (e.g., a conductive wire). In further embodiments, the patterning process may include: forming a masking layer (not shown) over the second ILD layer 104b; performing an etch process on the second ILD layer 104b and the etch stop structure 105 according to the masking layer, thereby defining the metallization opening 902 and exposing an upper surface of the capping layer 112; and performing a removal process to remove the masking layer.

Figure 20:
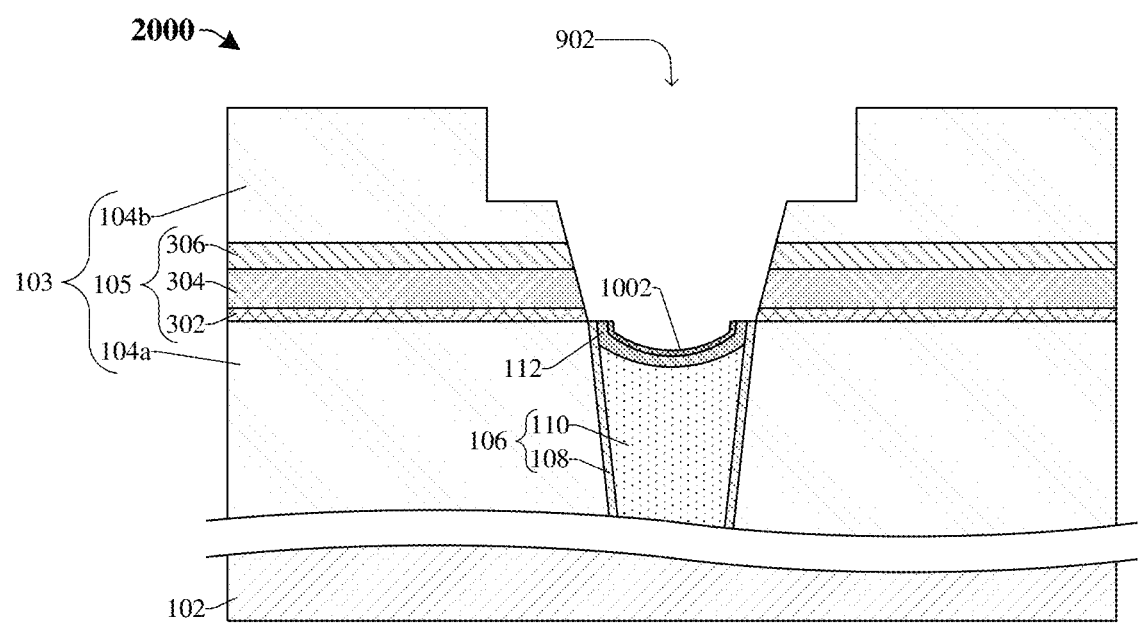

As shown in cross-sectional view 2000 of FIG. 20, a self-assembled monolayer (SAM) 1002 is selectively formed over the capping layer 112, such that the SAM 1002 conforms to the curved shape of the capping layer 112. In some embodiments, the SAM 1002 may be formed as illustrated and/or described in FIGS. 10A and 10B. In further embodiments, the SAM 1002 comprises a head group that adheres or bonds to the capping layer 112 but not to the second ILD layer 104b, the etch stop structure 105, and/or the lower conductive liner 108. In some embodiments, the SAM 1002 may be deposited onto the capping layer 112 by spin coating. In further embodiments, a process for forming the SAM 1002 includes: spinning the SAM 1002 onto the structure of FIG. 19, upon being spun onto the structure of FIG. 19 the SAM 1002 will adhere to the capping layer 112 but not to the second ILD layer 104b, the etch stop structure 105, and/or the lower conductive liner 108. In various embodiments, the SAM 1002 comprises the head group (1004 of FIG. 10B), the molecular chain (1006 of FIG. 10B), and the terminal group (1008 of FIG. 10B) as illustrated and described in FIG. 10B.

Figure 21:
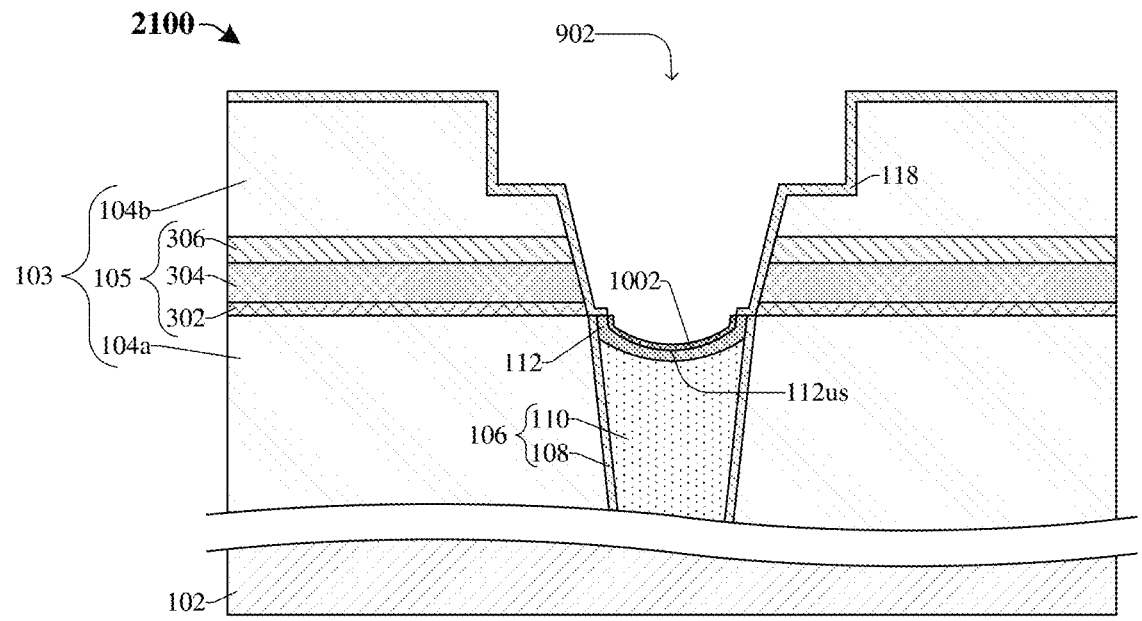

As shown in cross-sectional view 2100 of FIG. 21, the first diffusion barrier layer 118 is formed over the second ILD layer 104b and the etch stop structure 105. In various embodiments, the first diffusion barrier layer 118 is formed as illustrated and described in FIG. 11. In some embodiments, the first diffusion barrier layer 118 lines sidewalls of the second ILD layer 104b and the etch stop structure 105 defining the metallization opening 902. In some embodiments, the terminal group (1008 of FIG. 10B) of the SAM 1002 comprises the hydrophobic surface which prevents the first diffusion barrier layer 118 (e.g., tantalum nitride) from adhering or bonding to the SAM 1002. Thus, in some embodiments, the SAM 1002 is configured to prevent and/or block deposition of the first diffusion barrier layer 118 on the upper surface of the SAM 1002 such that the first diffusion barrier layer 118 may be selectively deposited in areas in which the SAM 1002 is not located.

Figure 22:
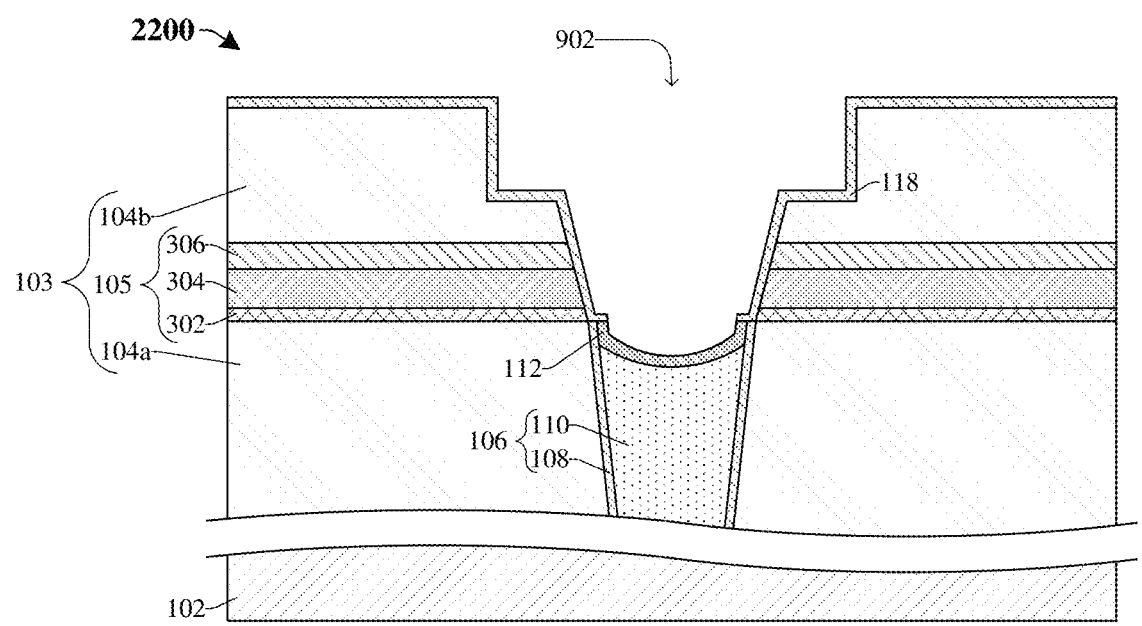

As shown in cross-sectional view 2200 of FIG. 22, a removal process is performed to remove the SAM (1002 of FIG. 21) from the upper surface of the capping layer 112. In some embodiments, the removal process includes exposing the structure of FIG. 21 to a removal plasma (e.g., hydrogen ($H_2$)) that is configured to remove the SAM (1002 of FIG. 21).

Figure 23:
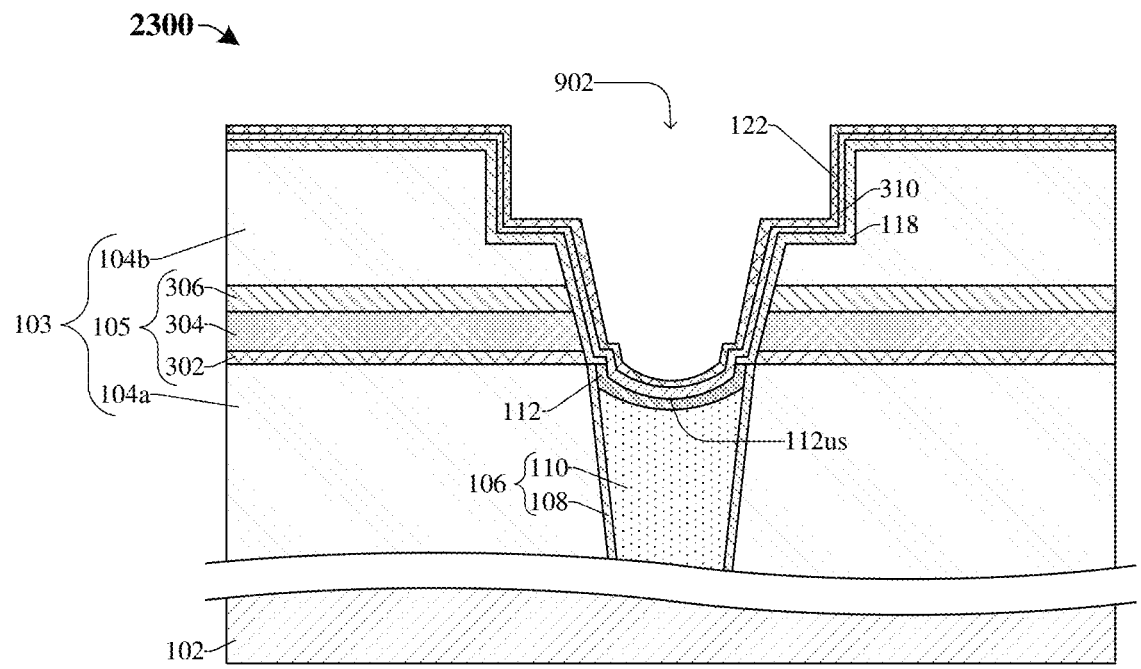

As shown in cross-sectional view 2300 of FIG. 23, a second diffusion barrier layer 310 is formed over the first diffusion barrier layer 118 and the capping layer 112. In some embodiments, the second diffusion barrier layer 310 may be formed as illustrated and/or described in FIG. 13. In further embodiments, the second diffusion barrier layer 310 is omitted, for example, as illustrated in FIGS. 4A, 4B, and 4D. In further embodiments, the second diffusion barrier layer 310 is deposited by a PVD process. In further embodiments, the adhesive liner 122 is formed over the second diffusion barrier layer 310. In some embodiments, the adhesive liner 122 is formed as illustrated and/or described in FIG. 14.

Figure 24:
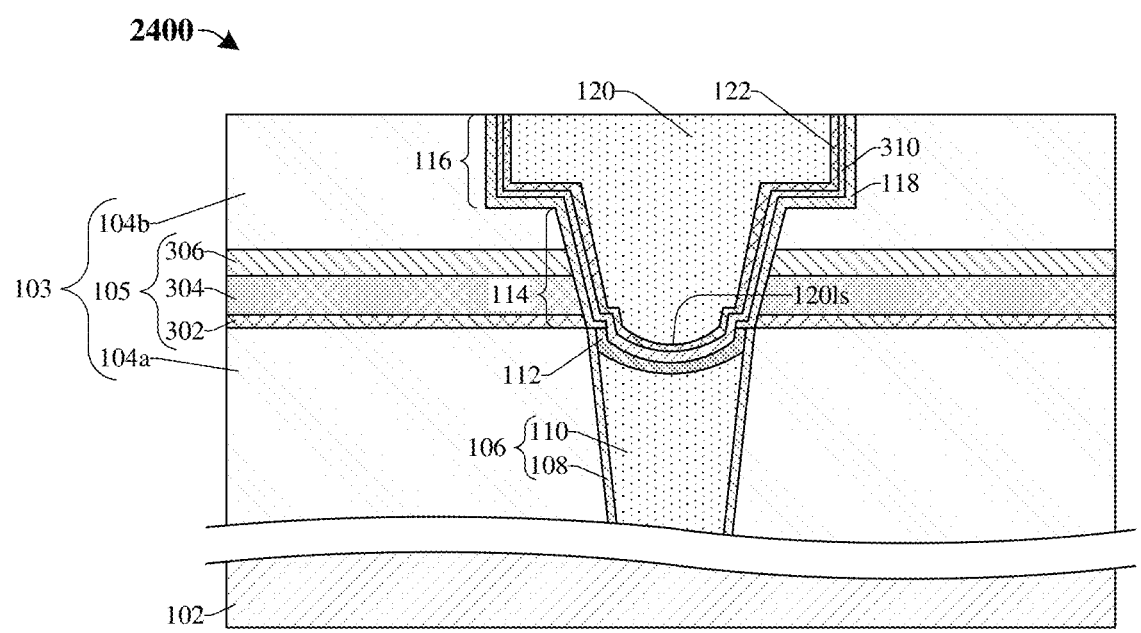

As shown in cross-sectional view 2400 of FIG. 24, a conductive body 120 is formed over the adhesive liner 122, thereby defining a conductive via 114 and a conductive wire 116. In some embodiments, the conductive body 120 is formed as illustrated and/or described in FIG. 15.

Figure 25:
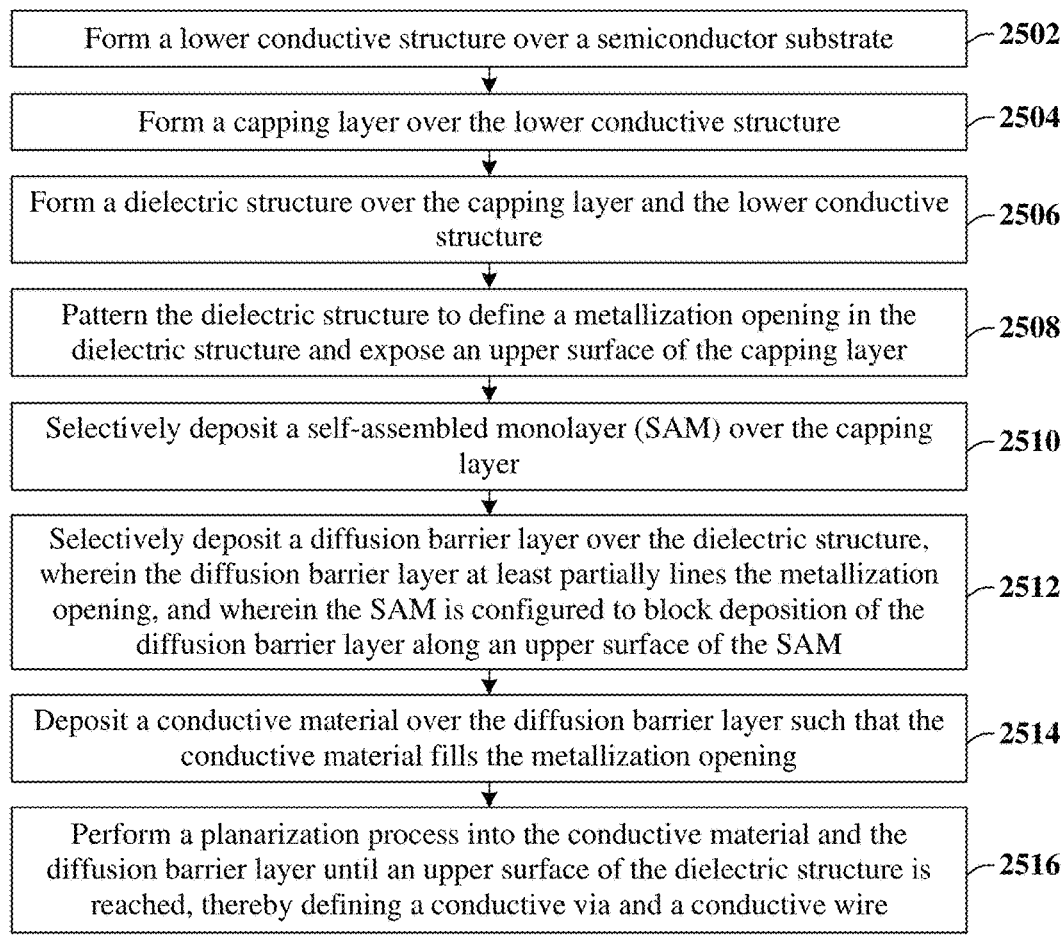
FIG. 25 illustrates a methodology in flowchart format that illustrates some embodiments of a method of forming a conductive via and a conductive wire with a diffusion barrier layer configured to decrease contact resistance.

FIG. 25 illustrates a method 2500 of forming a conductive via and a conductive wire with a diffusion barrier layer overlying a lower conductive structure according to the present disclosure. Although the method 2500 is illustrated and/or described as a series of acts or events, it will be appreciated that the method 2500 is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2502, a lower conductive structure is formed over a semiconductor substrate. FIG. 7 illustrates a cross-sectional view 700 corresponding to some embodiments of act 2502. FIG. 16 illustrates a cross-sectional view 1600 corresponding to some alternative embodiments of act 2502.

At act 2504, a capping layer is formed over the lower conductive structure. FIG. 7 illustrates a cross-sectional view 700 corresponding to some embodiments of act 2504. FIGS. 17 and 18 illustrate cross-sectional views 1700 and 1800 corresponding to some alternative embodiments of act 2504.

At act 2506, a dielectric structure is formed over the capping layer and the lower conductive structure. FIG. 8 illustrates a cross-sectional view 800 corresponding to some embodiments of act 2506. FIG. 19 illustrates a cross-sectional view 1900 corresponding to some alternative embodiments of act 2506.

At act 2508, the dielectric structure is patterned to define a metallization opening in the dielectric structure and expose an upper surface of the capping layer. FIG. 9 illustrates a cross-sectional view 900 corresponding to some embodiments of act 2508. FIG. 19 illustrates a cross-sectional view 1900 corresponding to some alternative embodiments of act 2508.

At act 2510, a self-assembled monolayer (SAM) is selectively deposited over the capping layer. FIGS. 10A and 10B illustrate cross-sectional views 1000 and 1001 corresponding to some embodiments of act 2510. FIG. 20 illustrates a cross-sectional view 2000 corresponding to some alternative embodiments of act 2510.

At act 2512, a diffusion barrier layer is selectively deposited over the dielectric structure. The diffusion barrier layer at least partially lines the metallization opening. The SAM is configured to block deposition of the diffusion barrier layer along an upper surface of the SAM. FIG. 11 illustrates a cross-sectional view 1100 corresponding to some embodiments of act 2512. FIG. 21 illustrates a cross-sectional view 2100 corresponding to some alternative embodiments of act 2512.

At act 2514, a conductive material is deposited over the diffusion barrier layer such that the conductive material fills the metallization opening. FIG. 15 illustrates a cross-sectional view 1500 corresponding to some embodiments of act 2514. FIG. 24 illustrates a cross-sectional view 2400 corresponding to some alternative embodiments of act 2514.

At act 2516, a planarization process is performed into the conductive material and the diffusion barrier layer until an upper surface of the dielectric structure is reached, thereby defining a conductive via and a conductive wire. FIG. 15 illustrates a cross-sectional view 1500 corresponding to some embodiments of act 2516. FIG. 24 illustrates a cross-sectional view 2400 corresponding to some alternative embodiments of act 2516.

Accordingly, in some embodiments, the present application relates to a conductive via overlying a lower conductive structure, in which the conductive via comprises a diffusion barrier layer laterally enclosing a conductive body. A bottom surface of the conductive body directly overlies a top surface of the lower conductive structure within a contact interface region, in which the diffusion barrier layer is laterally offset from the contact interface region.

In various embodiments, the present application provides a semiconductor structure including a first inter-level dielectric (ILD) layer disposed over a semiconductor substrate; a lower conductive structure disposed within the first ILD layer; a capping layer continuously extending along a top surface of the lower conductive structure; an upper ILD structure overlying the lower conductive structure and the first ILD layer; a conductive body disposed within the upper ILD structure and directly overlying the capping layer, wherein a bottom surface of the conductive body directly overlies the top surface of the lower conductive structure, wherein a width of the bottom surface of the conductive body is less than a width of the top surface of the lower conductive structure; and a first diffusion barrier layer disposed between sidewalls of the conductive body and sidewalls of the upper ILD structure, wherein the first diffusion barrier layer is laterally offset from a region disposed directly between the bottom surface of the conductive body and the top surface of the lower conductive structure by a non-zero distance.

In various embodiments, the present application provides a semiconductor device including a lower conductive structure disposed within a first inter-level dielectric (ILD) layer that overlies a semiconductor substrate, wherein the lower conductive structure includes a lower conductive body that comprises a first conductive material; a capping layer extending along an upper surface of the lower conductive structure, wherein the capping layer comprises a second conductive material different than the second conductive material; an etch stop structure overlying the lower conductive structure; a second ILD layer overlying the etch stop structure; a conductive via disposed within the etch stop structure and the second ILD layer, wherein the conductive via contacts the capping layer, and wherein the conductive via includes a conductive body directly overlying the lower conductive structure and comprising the first conductive material, wherein a bottom surface of the conductive body is vertically offset from a top surface of the capping layer by a contact interface region; an adhesive liner continuously extending along a bottom surface of the conductive body and continuously laterally enclosing the conductive body, wherein the adhesive liner comprises the second conductive material, wherein the adhesive liner continuously laterally extends along the contact interface region; and a first diffusion barrier layer continuously laterally enclosing the adhesive liner and comprising a third conductive material, wherein the third conductive material has a higher resistivity than the first and second conductive materials, wherein the first diffusion barrier layer is laterally offset from the contact interface region by a non-zero distance.

In various embodiments, the present application provides a method for forming a semiconductor device, the method including forming a capping layer along an upper surface of a lower conductive structure located over a semiconductor substrate; forming an upper dielectric structure over the capping layer, wherein the upper dielectric structure comprises sidewalls defining a metallization opening directly over the capping layer; selectively depositing a self-assembled monolayer (SAM) along an upper surface of the capping layer; selectively depositing a first diffusion barrier layer on the upper dielectric structure, wherein the first diffusion barrier layer lines sidewalls of the upper dielectric structure defining the metallization opening, wherein the SAM is configured to block deposition of the first diffusion barrier layer along an upper surface of the SAM; performing a removal process to remove the SAM from the upper surface of the capping layer; depositing an adhesive liner over the first diffusion barrier layer; depositing a conductive body over the adhesive liner, wherein the conductive body fills the metallization opening; and performing a planarization process into the first diffusion barrier layer, the adhesive liner, and the conductive body until an upper surface of the upper dielectric structure is reached, thereby defining a conductive via and a conductive wire.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a lower conductive structure within a first dielectric layer over a substrate;
   forming an upper dielectric structure over the lower conductive structure, wherein the upper dielectric structure comprises sidewalls defining an opening over the lower conductive structure;
   selectively depositing a first liner layer along the sidewalls of the upper dielectric structure; and
   forming a conductive body within the opening and over the lower conductive structure, wherein the conductive body has a bottom surface directly overlying a middle region of the lower conductive structure, wherein the first liner layer is laterally offset from the middle region of the lower conductive structure by a non-zero distance.

2. The method of claim 1, wherein the first liner layer is discontinuous along the middle region of the lower conductive structure.

3. The method of claim 1, wherein selectively depositing the first liner layer comprises:
   depositing a blocking layer over the lower conductive structure;
   depositing the first liner layer with the blocking layer in place, wherein the blocking layer is configured to block deposition of the first liner layer from over the middle region of the lower conductive structure; and
   performing a removal process to remove the blocking layer from over the lower conductive structure.

4. The method of claim 3, wherein a bottom surface of the first liner layer is vertically offset from a top surface of the lower conductive structure by a vertical distance, wherein the vertical distance is equal to or greater than a thickness of the blocking layer before the removal process.

5. The method of claim 1, wherein forming the lower conductive structure comprises:
   forming a lower conductive body within the first dielectric layer, and
   forming a capping layer along a top surface of the lower conductive body, wherein an area of a top surface of the capping layer is greater than an area of a bottom surface of the first liner layer.

6. The method of claim 1, wherein an area of a bottom surface of the first liner layer is less than an area of the bottom surface of the conductive body.

7. The method of claim 6, further comprising:
   forming a second liner layer between the first liner layer and the conductive body, wherein a bottom surface of the second liner layer continuously laterally extends along the middle region, and wherein an area of the bottom surface of the second liner layer is greater than the area of the bottom surface of the conductive body.

8. The method of claim 1, wherein the bottom surface of the conductive body is disposed below a bottom surface of the first liner layer.

9. A method for forming a semiconductor device, comprising:
   forming a lower conductive structure over a substrate;
   forming a dielectric structure over the lower conductive structure;
   patterning the dielectric structure to form an opening over the lower conductive structure;
   depositing a first liner layer within the opening, wherein the first liner layer has a bottom surface that is discontinuous over a center region of a top surface of the lower conductive structure; and
   forming a conductive structure within the opening, wherein a bottom surface of the conductive structure continuously extends over the center region of the top surface of the lower conductive structure.

10. The method of claim 9, wherein the bottom surface of the first liner layer is ring-shaped when viewed from a top view.

11. The method of claim 9, further comprising:
    forming a second liner layer within the opening and on the first liner layer, wherein a bottom surface of the second liner layer is aligned with or vertically below the bottom surface of the first liner layer.

12. The method of claim 11, wherein the bottom surface of the second liner layer is continuous over the center region of the top surface of the lower conductive structure.

13. The method of claim 9, wherein forming the lower conductive structure comprises:
    forming a lower liner layer within a dielectric layer over the substrate;

forming a lower conductive body over and between opposing sidewalls of the lower liner layer; and forming a capping layer along a top surface of the lower conductive body.

14. The method of claim 13, wherein before forming the capping layer an etch process is performed on the lower conductive body to recess the top surface of the lower conductive body below a top surface of the lower liner layer.

15. The method of claim 9, wherein the bottom surface of the first liner layer is hollow.

16. A method of forming a semiconductor device, comprising:

forming a capping layer along an upper surface of a lower conductive structure located over a semiconductor substrate;

forming an upper dielectric structure over the capping layer, wherein the upper dielectric structure comprises sidewalls defining a metallization opening directly over the capping layer;

selectively depositing a self-assembled monolayer (SAM) along an upper surface of the capping layer;

selectively depositing a first diffusion barrier layer on the upper dielectric structure, wherein the first diffusion barrier layer lines sidewalls of the upper dielectric structure defining the metallization opening, wherein the SAM is configured to block deposition of the first diffusion barrier layer along an upper surface of the SAM;

performing a removal process to remove the SAM from the upper surface of the capping layer;

depositing an adhesive liner over the first diffusion barrier layer;

depositing a conductive body over the adhesive liner, wherein the conductive body fills the metallization opening; and performing a planarization process into the first diffusion barrier layer, the adhesive liner, and the conductive body, thereby defining a conductive via and a conductive wire.

17. The method of claim 16, further comprising:

depositing a second diffusion barrier layer between the adhesive liner and the first diffusion barrier layer, wherein a thickness of the second diffusion barrier layer is less than a thickness of the first diffusion barrier layer.

18. The method of claim 17, wherein the first diffusion barrier layer is deposited by an atomic layer deposition (ALD) process and the second diffusion barrier layer is deposited by a physical vapor deposition (PVD) process.

19. The method of claim 16, wherein the removal process includes exposing the SAM to hydrogen ($H_2$).

20. The method of claim 16, wherein the first diffusion barrier layer is selectively deposited such that the first diffusion barrier layer does not continuously laterally extend along the upper surface of the capping layer.

\* \* \* \* \*